United States Patent
Takagi et al.

(10) Patent No.: US 9,673,072 B2
(45) Date of Patent: Jun. 6, 2017

(54) SUBSTRATE PROCESSING DEVICE, SUBSTRATE PROCESSING METHOD, AND SUBSTRATE PROCESSING SYSTEM

(71) Applicant: SCREEN Holdings Co., Ltd., Kyoto (JP)

(72) Inventors: Katsuaki Takagi, Kyoto (JP); Seiichiro Sano, Kyoto (JP); Yuzo Uchida, Kyoto (JP); Satoshi Yamanaka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/911,385

(22) PCT Filed: Jul. 10, 2014

(86) PCT No.: PCT/JP2014/068460
§ 371 (c)(1),
(2) Date: Feb. 10, 2016

(87) PCT Pub. No.: WO2015/022826
PCT Pub. Date: Feb. 19, 2015

(65) Prior Publication Data
US 2016/0189991 A1    Jun. 30, 2016

(30) Foreign Application Priority Data
Aug. 15, 2013 (JP) ................................. 2013-168952

(51) Int. Cl.
*H01L 21/67* (2006.01)
*G05B 15/02* (2006.01)
(Continued)

(52) U.S. Cl.
CPC ........ *H01L 21/67155* (2013.01); *G05B 15/02* (2013.01); *G05B 19/41865* (2013.01);
(Continued)

(58) Field of Classification Search
CPC ......... H01L 21/67155; H01L 21/67253; H01L 21/67276; H01L 21/67706; H01L 21/67742
See application file for complete search history.

(56) References Cited

U.S. PATENT DOCUMENTS 5,696,689 A    12/1997  Okumura et al. ....... 364/468.28
6,970,770 B2 * 11/2005  Iijima ............... H01L 21/67167
                                                          414/217
(Continued)

FOREIGN PATENT DOCUMENTS

JP    09-007912    1/1997
JP    10-321575    12/1998
(Continued)

OTHER PUBLICATIONS

International Search Report mailed Oct. 7, 2014 in corresponding PCT International Application No. PCT/JP2014/068460.
(Continued)

*Primary Examiner* — Kaitlin Joerger
(74) *Attorney, Agent, or Firm* — Ostrolenk Faber LLP

(57) ABSTRACT

A second control device of a second substrate processing apparatus determines whether the processing-start expected time for a substrate is equal to or earlier than a processing-start time limit. If the processing-start expected time is equal to or earlier than the processing-start time limit, the second control device allows the second substrate processing apparatus to execute a first schedule and a second schedule that are initial schedules. On the other hand, if the processing-start expected time is later than the processing-start time limit, the second control device changes the initial first schedule and the initial second schedule so that the processing-start expected time becomes equal to or earlier than the processing-start time limit, and the second control device allows the second substrate processing apparatus to execute the first schedule and the second schedule that have been changed.

12 Claims, 16 Drawing Sheets

(51) Int. Cl.
 *H01L 21/677* (2006.01)
 *G05B 19/418* (2006.01)
(52) U.S. Cl.
 CPC .. *H01L 21/67253* (2013.01); *H01L 21/67276* (2013.01); *H01L 21/67706* (2013.01); *H01L 21/67742* (2013.01); *G05B 2219/32078* (2013.01); *G05B 2219/45031* (2013.01); *Y02P 90/20* (2015.11)

(56) References Cited

U.S. PATENT DOCUMENTS

| | | | | |
|---|---|---|---|---|
| 8,868,233 | B2 * | 10/2014 | Shibata | G05B 19/41865 700/213 |
| 2009/0000543 | A1 | 1/2009 | Fukutomi et al. | 118/58 |
| 2009/0292388 | A1 * | 11/2009 | Iimori | G05B 19/41865 700/112 |
| 2013/0178971 | A1 | 7/2013 | Hashimoto et al. | 700/121 |
| 2014/0358271 | A1 | 12/2014 | Asakawa et al. | 700/112 |
| 2015/0364353 | A1 * | 12/2015 | Sugizaki | H01L 21/67715 198/348 |

FOREIGN PATENT DOCUMENTS

| | | |
|---|---|---|
| JP | 2005-223031 | 8/2005 |
| TW | 201243933 A1 | 11/2012 |
| TW | 201250914 A1 | 12/2012 |
| TW | 201314396 A1 | 4/2013 |

OTHER PUBLICATIONS

Written Opinion mailed Oct. 7, 2014 in corresponding PCT International Application No. PCT/JP2014/068460.

* cited by examiner

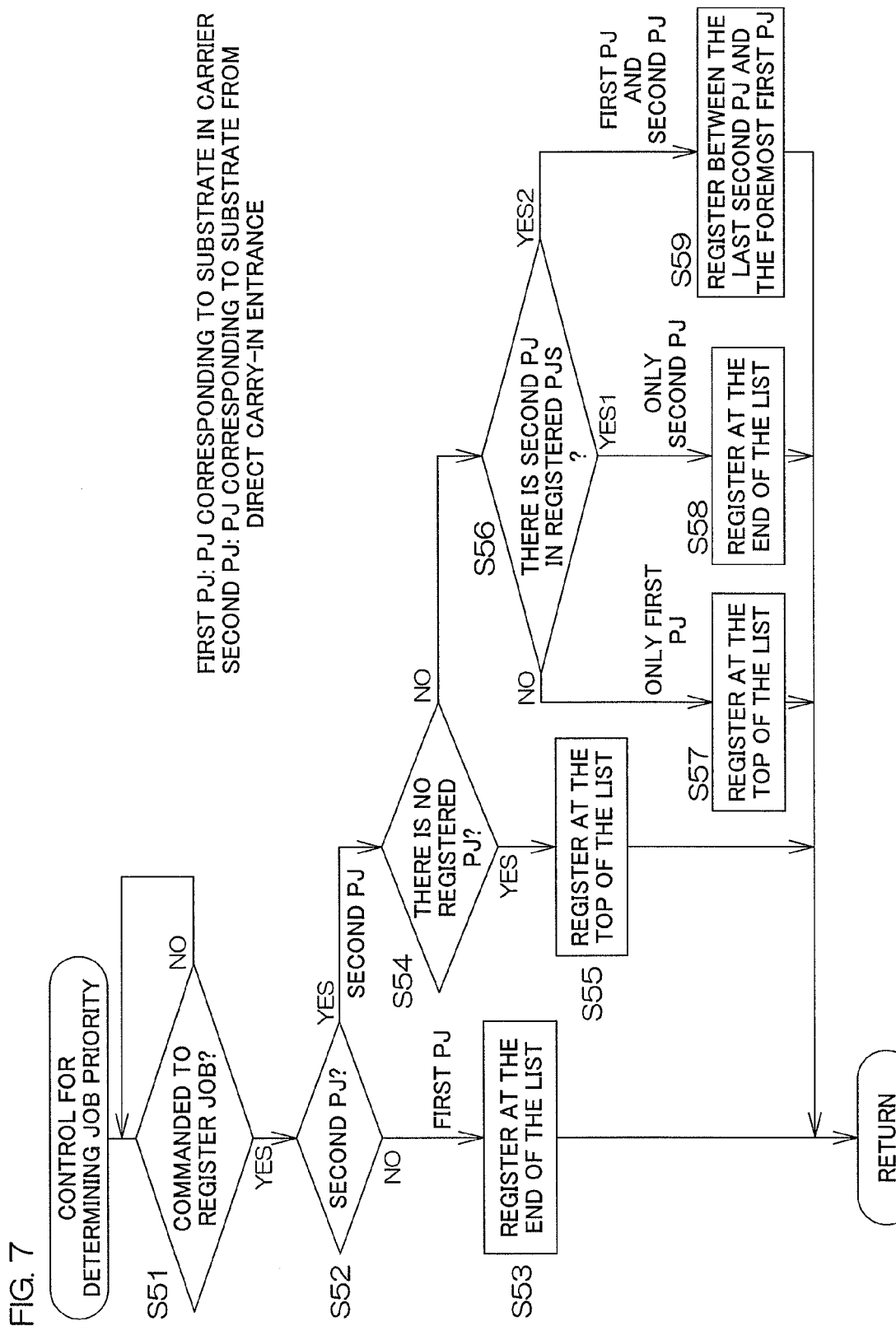

FIG. 8A

| CREATED PJ | | JOB MANAGEMENT LIST | |
|---|---|---|---|
| LOAD PORT | INTERMEDIATE APPARATUS | STATUS | REGISTERED PJ (UPPER SIDE TAKING PRECEDENCE) |
| PJ1 | | STOP RELEASE | PJ1 |
| PJ2 | | STOP RELEASE | PJ2 |
| PJ3 | | STOP RELEASE | PJ3 |
| PJ4 | | STOP RELEASE | PJ4 |
| PJ5 | | STOP RELEASE | PJ5 |
| PJ6 | | STOP RELEASE | PJ6 |
| PJ7 | | STOP RELEASE | PJ7 |
| PJ8 | | STOP RELEASE | PJ8 |
| PJ9 | | STOP RELEASE | PJ9 |
| PJ10 | | STOP RELEASE | PJ10 |

FIG. 8B

| CREATED PJ | | JOB MANAGEMENT LIST | |
|---|---|---|---|
| LOAD PORT | INTERMEDIATE APPARATUS | STATUS | REGISTERED PJ (UPPER SIDE TAKING PRECEDENCE) |
| PJ1 | PJA | DISBURSEMENT STOP | PJA |
| PJ2 | | BEING PROCESSED | PJ1 |
| PJ3 | | BEING PROCESSED | PJ2 |
| PJ4 | | BEING PROCESSED | PJ3 |
| PJ5 | | BEING PROCESSED | PJ4 |
| PJ6 | | BEING PROCESSED | PJ5 |
| PJ7 | | STOP RELEASE | PJ6 |
| PJ8 | | STOP RELEASE | PJ7 |
| PJ9 | | STOP RELEASE | PJ8 |
| PJ10 | | STOP RELEASE | PJ9 |
| | | STOP RELEASE | PJ10 |

FIG. 8C

| CREATED PJ | | JOB MANAGEMENT LIST | |
|---|---|---|---|
| LOAD PORT | INTERMEDIATE APPARATUS | STATUS | REGISTERED PJ (UPPER SIDE TAKING PRECEDENCE) |
| PJ1 | PJA | STOP RELEASE | PJA |
| PJ2 | PJB | DISBURSEMENT STOP | PJB |
| PJ3 | | BEING PROCESSED | PJ1 |
| PJ4 | | BEING PROCESSED | PJ2 |
| PJ5 | | BEING PROCESSED | PJ3 |
| PJ6 | | BEING PROCESSED | PJ4 |
| PJ7 | | BEING PROCESSED | PJ5 |
| PJ8 | | STOP RELEASE | PJ6 |
| PJ9 | | STOP RELEASE | PJ7 |
| PJ10 | | STOP RELEASE | PJ8 |
| | | STOP RELEASE | PJ9 |
| | | STOP RELEASE | PJ10 |

FIG. 8D

| CREATED PJ | | | JOB MANAGEMENT LIST | |
|---|---|---|---|---|
| LOAD PORT | INTERMEDIATE APPARATUS | LOAD PORT | STATUS | REGISTERED PJ (UPPER SIDE TAKING PRECEDENCE) |
| PJ1 | PJA | PJ11 | BEING PROCESSED | PJA |
| PJ2 | PJB | PJ12 | STOP RELEASE | PJB |
| PJ3 | | PJ13 | BEING PROCESSED | PJ1 |
| PJ4 | | PJ14 | BEING PROCESSED | PJ2 |
| PJ5 | | PJ15 | BEING PROCESSED | PJ3 |
| PJ6 | | PJ16 | BEING PROCESSED | PJ4 |
| PJ7 | | PJ17 | BEING PROCESSED | PJ5 |
| PJ8 | | PJ18 | STOP RELEASE | PJ6 |
| PJ9 | | PJ19 | STOP RELEASE | PJ7 |
| PJ10 | | PJ20 | STOP RELEASE | PJ8 |
| | | | STOP RELEASE | PJ9 |
| | | | STOP RELEASE | PJ10 |
| | | | DISBURSEMENT STOP | PJ11 |
| | | | DISBURSEMENT STOP | PJ12 |
| | | | DISBURSEMENT STOP | PJ13 |
| | | | DISBURSEMENT STOP | PJ14 |
| | | | DISBURSEMENT STOP | PJ15 |
| | | | DISBURSEMENT STOP | PJ16 |
| | | | DISBURSEMENT STOP | PJ17 |
| | | | DISBURSEMENT STOP | PJ18 |
| | | | DISBURSEMENT STOP | PJ19 |
| | | | DISBURSEMENT STOP | PJ20 |

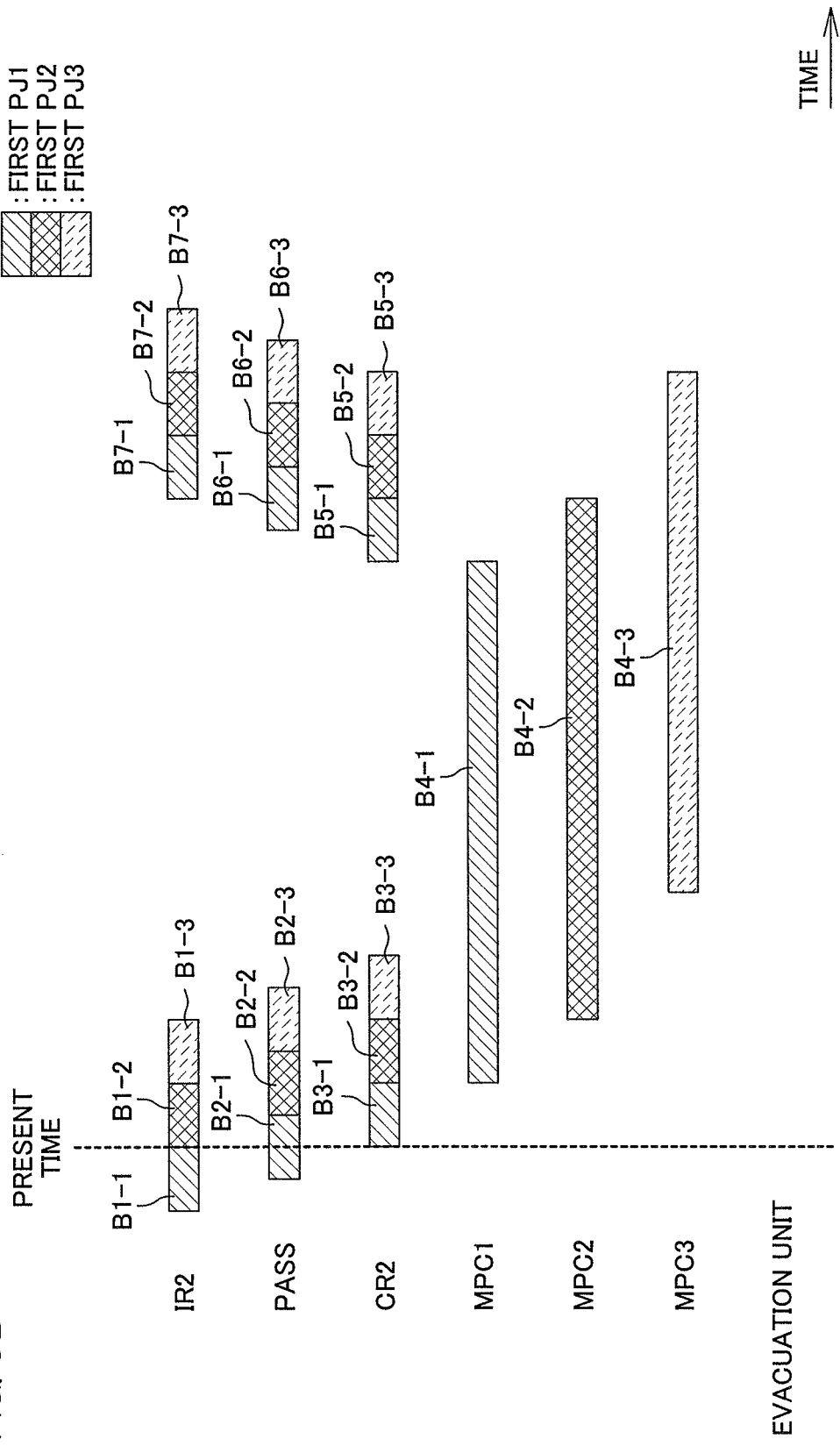

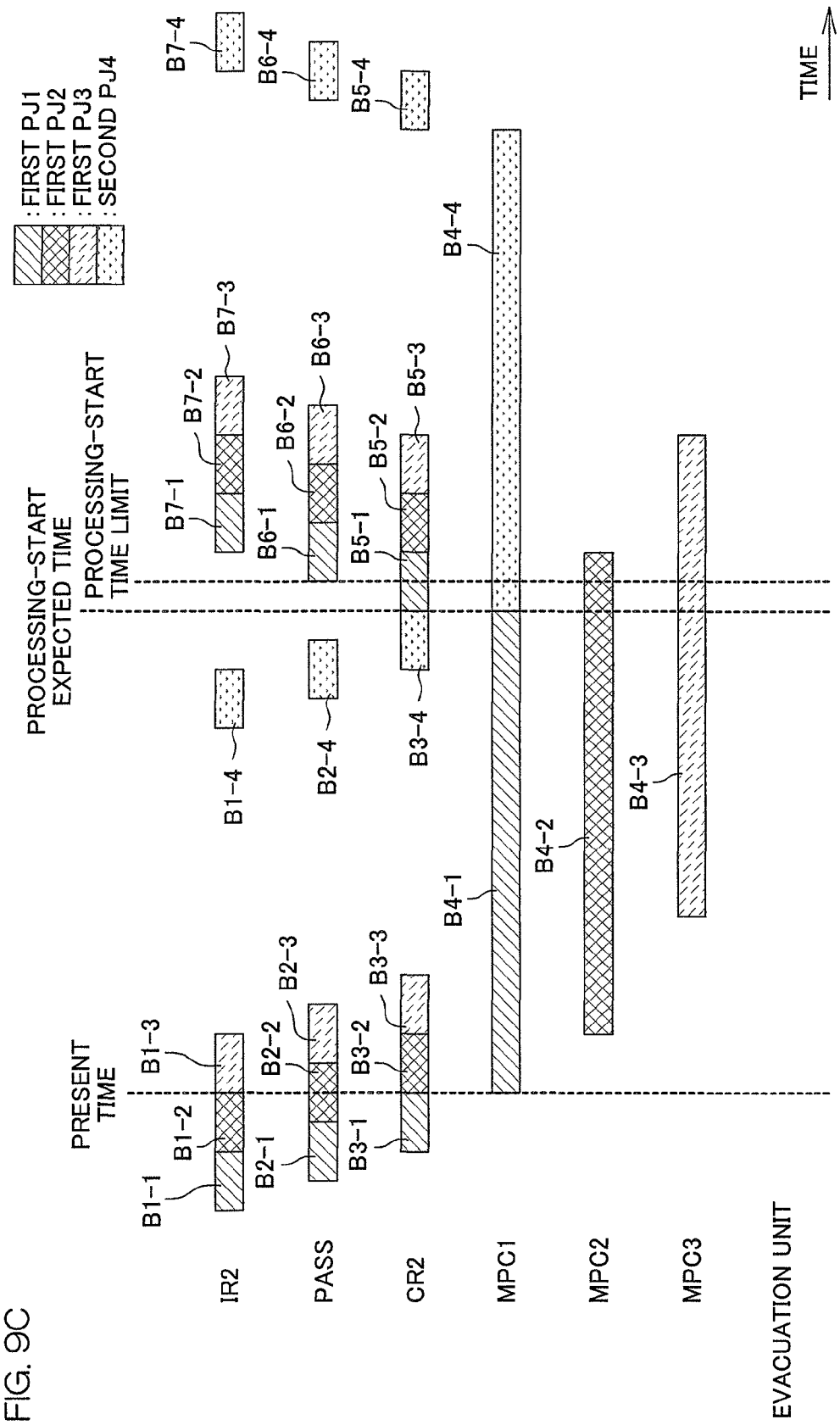

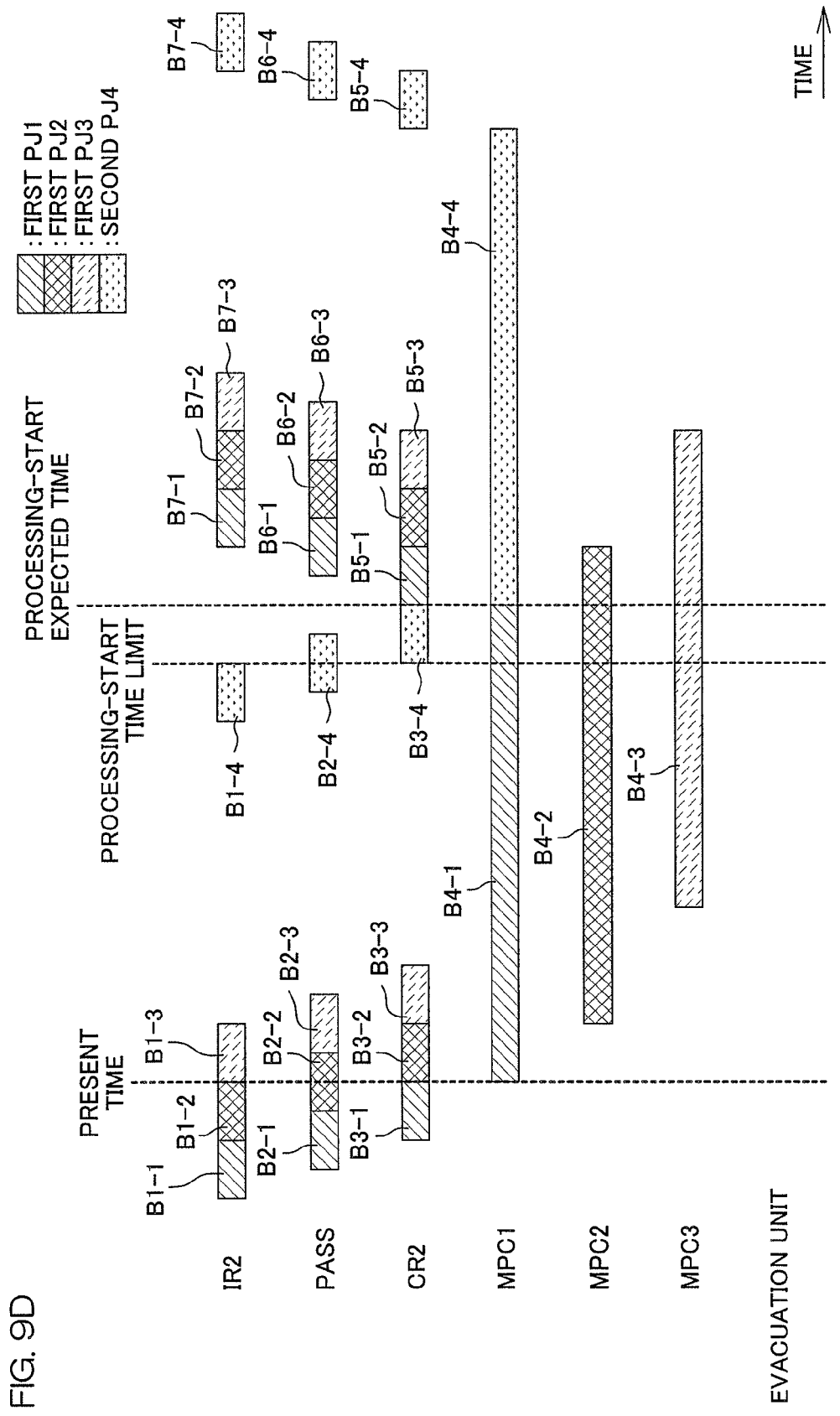

SUBSTRATE PROCESSING DEVICE, SUBSTRATE PROCESSING METHOD, AND SUBSTRATE PROCESSING SYSTEM

CROSS-REFERENCE TO RELATED APPLICATIONS

The present application is a 35 U.S.C. §§371 national phase conversion of PCT/JP2014/068460, filed Jul. 10, 2014, which claims priority to Japanese Patent Application No. 2013-168952, filed Aug. 15, 2013, the contents of both of which are incorporated herein by reference. The PCT International Application was published in the Japanese language.

FIELD OF THE ART

The present invention relates to a substrate processing apparatus that processes substrates, relates to a substrate processing method, and relates to a substrate processing system. Examples of substrates to be processed include a semiconductor wafer, a substrate for use in liquid crystal display devices, a substrate for use in plasma displays, a substrate for use in FEDs (Field Emission Displays), a substrate for use in optical disks, a substrate for use in magnetic disks, a substrate for use in magnet-optical disks, a substrate for use in photomasks, a ceramic substrate, and a substrate for use in solar batteries.

BACKGROUND ART

In a process of manufacturing a semiconductor device or a liquid crystal display device, many steps that include two or more steps among a cleaning step, a heating step, a film forming step, an etching step, a resist applying step, an exposing step, and a developing step are performed for a substrate, such as a semiconductor wafer or a glass substrate that is used in a liquid crystal display device.

Patent Document 1 discloses a film-formation processing device that performs film formation, a cleaning device that cleans a substrate that has undergone film formation by means of the film-formation processing device, an intermediate receiving/delivering portion that receives and delivers the substrate between the film-formation processing device and the cleaning device, and a cassette transfer device that transfers a substrate-transfer cassette that contains a plurality of substrates to the film-formation processing device. A substrate that has been processed by the film-formation processing device is conveyed to the cleaning device through the intermediate receiving/delivering portion, and is cleaned by the cleaning device. The cleaning device includes a carry-in/carry-out table on which the substrate-conveying cassette is placed. The cleaning device cleans a substrate that has been carried in from the intermediate receiving/delivering portion, and cleans the substrate that has been carried out of the cassette placed on the carry-in/carry-out table of the cleaning device.

PRIOR ART DOCUMENT

Patent Document

Patent Document 1: Japanese Patent Application Publication No. 10-321575

SUMMARY OF THE INVENTION

Problems to be Solved by the Invention

As described in Patent Document 1, there is a case in which a period of time from the end of substrate processing in a substrate processing apparatus to the start of substrate processing in another substrate processing apparatus is desired to be shortened in order to raise the quality of a substrate. For example, it is herein assumed that in the arrangement of Patent Document 1, when the conveyance or the processing of a substrate that has been carried out from a cassette is performed by the cleaning device, an additional substrate is carried into the cleaning device from the intermediate receiving/delivering portion. In this case, a resource of the cleaning device, such as a substrate transfer mechanism or a cleaning unit, is used for substrates carried out of the cassette, and therefore there is a possibility that the start time of the processing of the additional substrate will exceed the processing-start time limit, and the quality of the substrate will lower.

Therefore, an object of the present invention is to provide a substrate processing apparatus, a substrate processing method, and a substrate processing system that are capable of starting substrate processing before the time limit for starting the substrate processing.

Means for Solving the Problem

One preferred embodiment of the present invention to achieve the object provides a substrate processing apparatus connected to an intermediate apparatus, the intermediate apparatus conveying a substrate that has been processed by a first substrate processing apparatus that processes substrates in a state of directly supporting the substrate outside the first substrate processing apparatus, the substrate processing apparatus including a plurality of second load ports that hold a plurality of carriers that are capable of containing a plurality of substrates, respectively, a direct carry-in entrance that accepts a substrate carried in from the intermediate apparatus, a plurality of second processing units that process a substrate conveyed from at least either the plurality of second load ports or the direct carry-in entrance, a second transfer unit that conveys a substrate between the plurality of second load ports, the direct carry-in entrance, and the plurality of second processing units, and a second control device that controls the substrate processing apparatus.

The second control device executes a first step that creates a first schedule including a first carrying-in step of allowing the second transfer unit to convey a substrate from the plurality of second load ports to the plurality of second processing units, a first processing step of allowing the plurality of second processing units to process the substrate conveyed to the plurality of second processing units, and a first carrying-out step of allowing the second transfer unit to convey the substrate processed by the plurality of second processing units from the plurality of second processing units to the plurality of second load ports, a second step that creates a second schedule including a second carrying-in step of allowing the second transfer unit to convey a substrate processed by the first substrate processing apparatus from the direct carry-in entrance to the plurality of second processing units, a second processing step of allowing the plurality of second processing units to process the substrate conveyed to the plurality of second processing units, and a second carrying-out step of allowing the second transfer unit to convey the substrate processed by the plurality of second processing units from the plurality of second processing units to the plurality of second load ports so that at least one of the second carrying-in step, the second processing step, and the second carrying-out step is executed simultaneously with at least one of the first carrying-in step, the first processing step, and the first carrying-out step, a third step of determining whether processing-start expected time for a substrate planned in the second schedule is equal to or earlier than a processing-start time limit to allow the substrate processing apparatus to process a substrate processed by the first substrate processing apparatus, a fourth step of, if the processing-start expected time is later than the processing-start time limit in the third step, changing the first schedule and the second schedule so that the processing-start expected time becomes equal to or earlier than the processing-start time limit and allowing the substrate processing apparatus to execute the first schedule and the second schedule that have been changed, and a fifth step of, if the processing-start expected time is equal to or earlier than the processing-start time limit in the third step, allowing the substrate processing apparatus to execute the first schedule and the second schedule without changing the first schedule and the second schedule.

According to this arrangement, the second control device creates the first schedule so that a substrate contained in a carrier is conveyed from the second load port to the second processing unit and so that a substrate processed by the second processing unit is conveyed from the second processing unit to the second load port. The second control device further creates the second schedule so that a substrate processed by the first substrate processing apparatus is conveyed from the direct carry-in entrance to the second processing unit and so that a substrate processed by the second processing unit is conveyed from the second processing unit to the second load port. The second control device creates the second schedule so that at least one step included in the second schedule is executed simultaneously with at least one step included in the first schedule.

The second control device creates the second schedule, and then determines whether the processing-start expected time for a substrate planned in the second schedule is equal to or earlier than the processing-start time limit to process a substrate processed by the first substrate processing apparatus by means of the substrate processing apparatus. If the processing-start expected time is equal to or earlier than the processing-start time limit, the second control device allows the substrate processing apparatus to execute the initial first schedule and the initial second schedule (the first schedule and the second schedule created in the first step and the second step). On the other hand, if the processing-start expected time is later than the processing-start time limit, the second control device changes the initial first schedule and the initial second schedule so that the processing-start expected time becomes equal to or earlier than the processing-start time limit, and allows the substrate processing apparatus to execute the first schedule and the second schedule that have been changed. This makes it possible to start processing a substrate planned in the second schedule before the processing-start time limit, and makes it possible to prevent substrates from falling in quality.

The second step may be a step of creating the second schedule after a substrate processed by the first substrate processing apparatus arrives at the intermediate apparatus.

According to this arrangement, after a substrate processed by the first substrate processing apparatus arrives at the intermediate apparatus, the second schedule is created. The processing-start expected time for a substrate planned in the second schedule is the expected time when the substrate starts being processed by the substrate processing apparatus. In other words, there is a difference between a period of time actually required for an apparatus, such as a transfer robot, to perform an operation and an expected period of time regarded as being needed to perform this operation, and therefore it is difficult to expect the accurate time at which processing is actually started. In particular, uncertain factors will increase if the conveyance distance of a substrate is long, and therefore a difference between an actually necessary period of time and an expected period of time will be widened, and the accuracy of the processing-start expected time will fall. Therefore, it is possible to raise the accuracy of the processing-start expected time by creating the second schedule after a substrate arrives at the intermediate apparatus, i.e., after a substrate approaches the substrate processing apparatus so that the conveyance distance of the substrate becomes shorter. This makes it possible to compare more accurate processing-start expected time with the processing-start time limit, and hence makes it possible to start substrate processing, which is planned in the second schedule, before the processing-start time limit.

The substrate processing apparatus may further include an evacuation unit that evacuates a substrate. The fourth step may be a step of, if the processing-start expected time is later than the processing-start time limit in the third step, changing the first schedule so that a substrate is conveyed from the plurality of second load ports to the plurality of second processing units through the evacuation unit, and changing the second schedule so that a substrate carried in from the direct carry-in entrance is carried into the second processing unit scheduled to process a substrate in the first schedule that has not yet been changed so as to make the processing-start expected time earlier so that the processing-start expected time becomes equal to or earlier than the processing-start time limit and allowing the substrate processing apparatus to execute the first schedule and the second schedule that have been changed. Preferably, the evacuation unit is disposed outside a conveyance route (a conveying path in the substrate processing apparatus) of a substrate conveyed to the plurality of second processing units from the second load port or from the direct carry-in entrance.

According to this arrangement, if the processing-start expected time is later than the processing-start time limit, the second control device changes the initial first schedule so that a substrate is conveyed from the plurality of second load ports to the plurality of second processing units through the evacuation unit. The second control device further changes the initial second schedule so that a substrate carried in from the direct carry-in entrance is carried into the second processing unit scheduled to process a substrate in the first schedule that has not yet been changed, and, as a result, the processing-start expected time is made earlier so that the processing-start expected time becomes equal to or earlier than the processing-start time limit. Thereafter, the second control device allows the substrate processing apparatus to execute the first schedule and the second schedule that have been changed. As a result, substrate processing that corresponds to the second schedule takes precedence over substrate processing that corresponds to the first schedule, and the substrate processing that corresponds to the second schedule is started before the processing-start time limit.

The second control device may further execute a sixth step of setting a substrate processing condition in accordance with an inspection result of an inspection unit that inspects a substrate processed by the first substrate processing apparatus before the substrate is carried into the substrate processing apparatus. The second step may be a step of creating the second schedule so that the substrate is processed under the substrate processing condition in the second processing step.

According to this arrangement, a substrate processing condition is set in accordance with an inspection result of the inspection unit that inspects the quality of a substrate processed by the first substrate processing apparatus before this substrate is carried into the substrate processing apparatus. Additionally, the second control device creates the second schedule so that the second processing unit processes the substrate under a substrate processing condition according to the inspection result. Therefore, it is possible to process a substrate under a condition according to the quality of the substrate, and it is possible to raise the quality, such as cleanliness, of the substrate.

The sixth step may be a step of setting the substrate processing condition in accordance with an inspection result of the inspection unit provided in one of the first substrate processing apparatus and the intermediate apparatus.

According to this arrangement, the inspection unit is provided in one of the first substrate processing apparatus and the intermediate apparatus, and the quality of a substrate processed by the first substrate processing apparatus is inspected in one of the first substrate processing apparatus and the intermediate apparatus. If the inspection unit is provided in an apparatus other than the first substrate processing apparatus and the intermediate apparatus, a substrate is required to be conveyed to the outside of the first substrate processing apparatus and of the intermediate apparatus, and an extra conveying time therefor will occur. Therefore, it is possible to shorten a substrate conveyance period of time from the first substrate processing apparatus to the substrate processing apparatus by providing the inspection unit in one of the first substrate processing apparatus and the intermediate apparatus.

Another preferred embodiment of the present invention provides a substrate processing method executed by a substrate processing apparatus connected to an intermediate apparatus, the intermediate apparatus conveying a substrate that has been processed by a first substrate processing apparatus that processes substrates in a state of directly supporting the substrate outside the first substrate processing apparatus, the substrate processing apparatus including a plurality of second load ports that hold a plurality of carriers that are capable of containing a plurality of substrates, respectively, a direct carry-in entrance that accepts a substrate carried in from the intermediate apparatus, a plurality of second processing units that process a substrate conveyed from at least either the plurality of second load ports or the direct carry-in entrance, a second transfer unit that conveys a substrate among the plurality of second load ports, the direct carry-in entrance, and the plurality of second processing units, and a second control device that controls the substrate processing apparatus.

The substrate processing method includes a first step that creates a first schedule including a first carrying-in step of allowing the second transfer unit to convey a substrate from the plurality of second load ports to the plurality of second processing units, a first processing step of allowing the plurality of second processing units to process the substrate conveyed to the plurality of second processing units, and a first carrying-out step of allowing the second transfer unit to convey the substrate processed by the plurality of second processing units from the plurality of second processing units to the plurality of second load ports, a second step that creates a second schedule including a second carrying-in step of allowing the second transfer unit to convey a substrate processed by the first substrate processing apparatus from the direct carry-in entrance to the plurality of second processing units, a second processing step of allowing the plurality of second processing units to process the substrate conveyed to the plurality of second processing units, and a second carrying-out step of allowing the second transfer unit to convey the substrate processed by the plurality of second processing units from the plurality of second processing units to the plurality of second load ports, so that at least one of the second carrying-in step, the second processing step, and the second carrying-out step is executed simultaneously with at least one of the first carrying-in step, the first processing step, and the first carrying-out step, a third step of determining whether processing-start expected time for a substrate planned in the second schedule is equal to or earlier than a processing-start time limit to allow the substrate processing apparatus to process a substrate processed by the first substrate processing apparatus, a fourth step of, if the processing-start expected time is later than the processing-start time limit in the third step, changing the first schedule and the second schedule so that the processing-start expected time becomes equal to or earlier than the processing-start time limit and allowing the substrate processing apparatus to execute the first schedule and the second schedule that have been changed, and a fifth step of, if the processing-start expected time is equal to or earlier than the processing-start time limit in the third step, allowing the substrate processing apparatus to execute the first schedule and the second schedule without changing the first schedule and the second schedule. According to this method, it is possible to fulfill the same effects as the aforementioned ones.

The second step may be a step of creating the second schedule after a substrate processed by the first substrate processing apparatus arrives at the intermediate apparatus. According to this method, it is possible to fulfill the same effects as the aforementioned ones.

The substrate processing apparatus may further include an evacuation unit that evacuates a substrate. The fourth step may be a step of, if the processing-start expected time is later than the processing-start time limit in the third step, changing the first schedule so that a substrate is conveyed from the plurality of second load ports to the plurality of second processing units through the evacuation unit, and changing the second schedule so that a substrate carried in from the direct carry-in entrance is carried into the second processing unit scheduled to process a substrate in the first schedule that has not yet been changed so as to make the processing-start expected time earlier so that the processing-start expected time becomes equal to or the processing-start time limit and allowing the substrate processing apparatus to execute the first schedule and the second schedule that have been changed. According to this method, it is possible to fulfill the same effects as the aforementioned ones.

The substrate processing method may further include a sixth step of setting a substrate processing condition in accordance with an inspection result of an inspection unit that inspects a substrate processed by the first substrate processing apparatus before the substrate is carried into the substrate processing apparatus. The second step may be a step of creating the second schedule so that the substrate is processed under the substrate processing condition in the second processing step. According to this method, it is possible to fulfill the same effects as the aforementioned ones.

The sixth step may be a step of setting the substrate processing condition in accordance with an inspection result of the inspection unit provided in one of the first substrate processing apparatus and the intermediate apparatus. According to this method, it is possible to fulfill the same effects as the aforementioned ones.

Still another preferred embodiment of the present invention provides a substrate processing system including a first substrate processing apparatus that processes a substrate, the substrate processing apparatus, and an intermediate apparatus that conveys a substrate processed by the first substrate processing apparatus among the first substrate processing apparatus and the substrate processing apparatus in a state of directly supporting the substrate outside the first substrate processing apparatus. According to this arrangement, it is possible to fulfill the same effects as the aforementioned ones.

The foregoing and other objects, features and effects of the present invention will become more apparent from the following detailed description of the preferred embodiments with reference to the attached drawings.

BRIEF DESCRIPTION OF THE DRAWINGS

FIG. 7 is a flowchart to describe job priority determination control.

FIG. 8A is a list showing created PJs and registered PJs.
FIG. 8B is a list showing created PJs and registered PJs.
FIG. 8C is a list showing created PJs and registered PJs.
FIG. 8D is a list showing created PJs and registered PJs.

FIG. 9B is a time chart showing a schedule to process three substrates W correlated to three PJs, i.e., a first PJ1, a first PJ2, and a first PJ3, respectively.

FIG. 9C is a time chart showing schedules (three first schedules and one second schedule) to process four substrates W correlated to four PJs (three first PJs, i.e., first PJ1 to first PJ3 and one second PJ), respectively.

FIG. 9D is a time chart showing schedules (three first schedules and one second schedule) when processing-start expected time exceeds a processing-start time limit.

MODES FOR CARRYING OUT THE INVENTION

Figure 1:
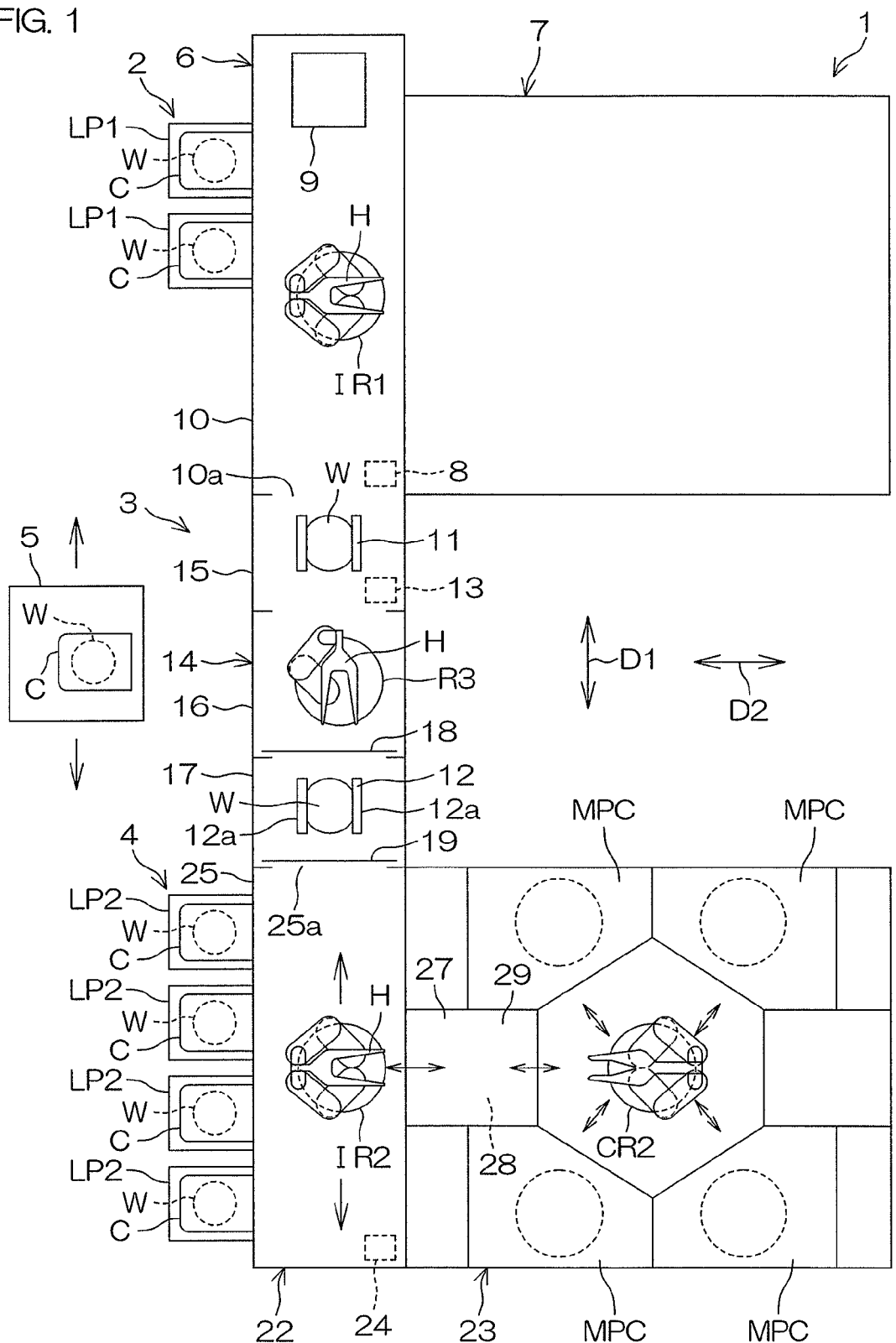
FIG. 1 is a schematic plan view of a substrate processing system 1 according to a preferred embodiment of the present invention.
Figure 2:
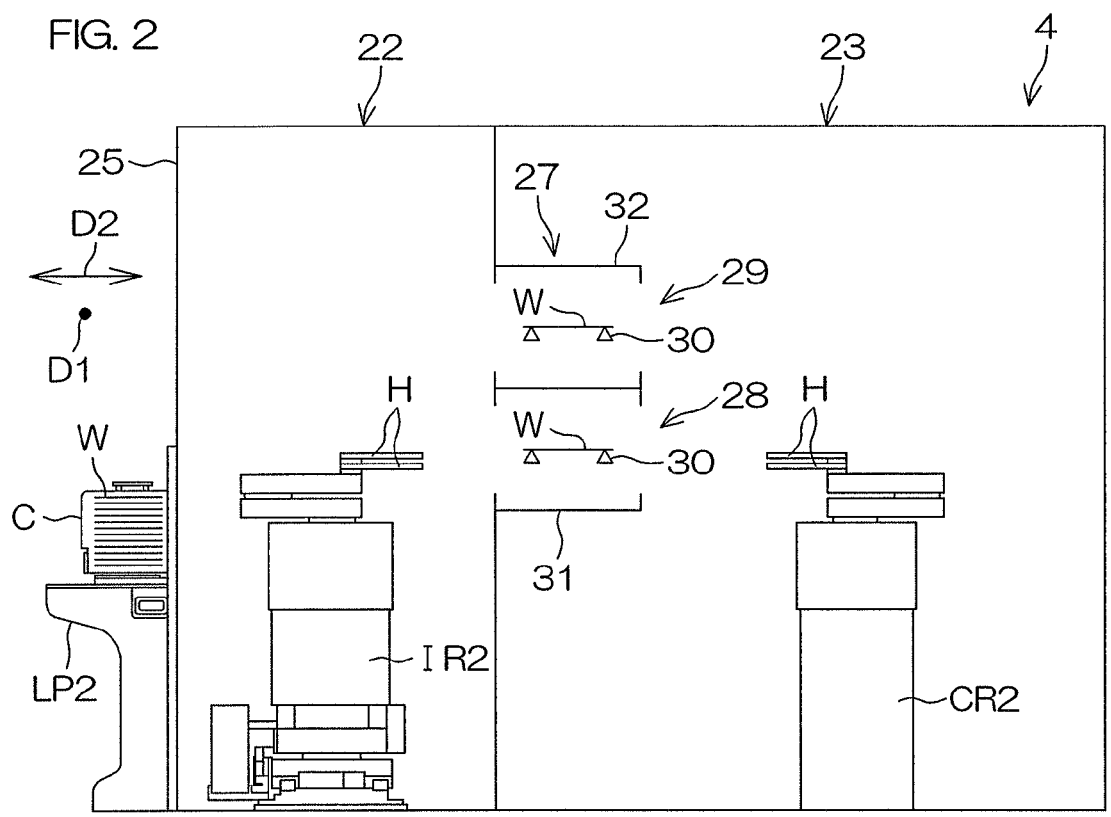
FIG. 2 is a schematic side view showing an arrangement of the inside of a second substrate processing apparatus 4 according to the preferred embodiment of the present invention.
Figure 3:
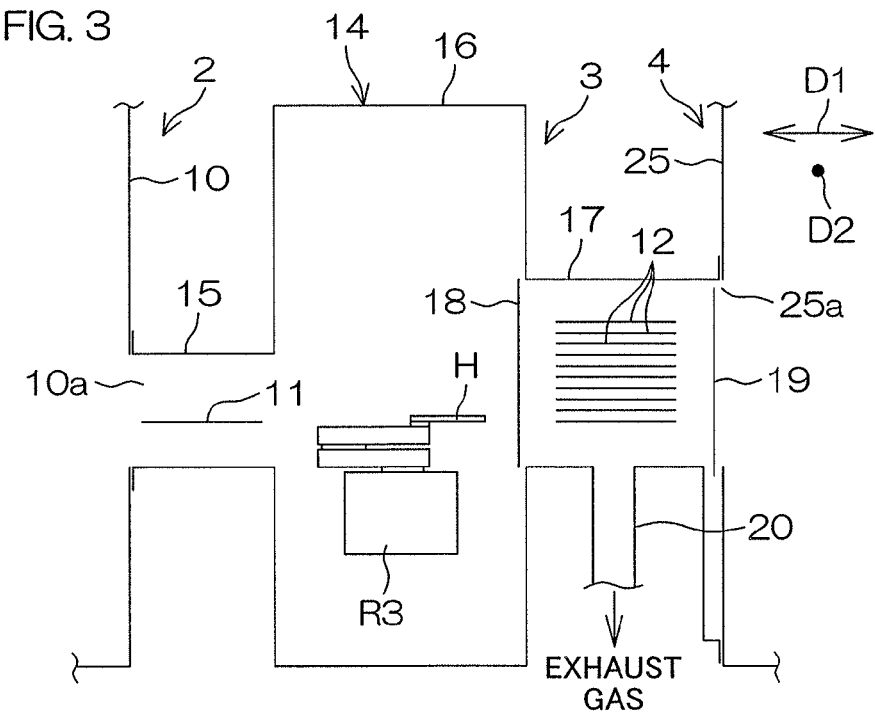
FIG. 3 is a schematic front view showing an arrangement of the inside of an intermediate apparatus 3 according to the preferred embodiment of the present invention.

FIG. 1 is a schematic plan view of a substrate processing system 1 according to a preferred embodiment of the present invention. FIG. 2 is a schematic side view showing an arrangement of the inside of a second substrate processing apparatus 4 according to the preferred embodiment of the present invention. FIG. 3 is a schematic front view showing an arrangement of the inside of an intermediate apparatus 3 according to the preferred embodiment of the present invention.

As shown in FIG. 1, the substrate processing system 1 includes a single substrate processing type first substrate processing apparatus 2 that processes substrates W one by one, a single substrate processing type second substrate processing apparatus 4 that processes substrates W one by one, an intermediate apparatus 3 that connects the first substrate processing apparatus 2 and the second substrate processing apparatus 4 together, and a carrier transfer robot 5 that transfers a carrier C (for example, FUOP) capable of containing a plurality of substrates W to the first substrate processing apparatus 2 and to the second substrate processing apparatus 4. The carrier C has its inner portion having a plurality of slots (shelves) disposed in the up-down direction with intervals therebetween. The carrier C is capable of supporting the substrates W by means of the slots such that the substrates W are stacked together up and down with intervals therebetween in a horizontal posture.

The first substrate processing apparatus 2 may be any of a cleaning apparatus, a heat treatment apparatus, a film formation apparatus, an etching apparatus, a resist applying apparatus, an exposure apparatus, and a developing apparatus, or may be an apparatus that performs other processing operations with respect to the substrate W. The same applies to the second substrate processing apparatus 4. Additionally, the first substrate processing apparatus 2 and the second substrate processing apparatus 4 may be apparatuses that perform the same kind of processing operation with respect to the substrate W, or may be apparatuses that perform mutually-different kind of processing operations with respect to the substrate W. An example will be hereinafter described in which the first substrate processing apparatus 2 is a dry etching apparatus and in which the second substrate processing apparatus 4 is a wet cleaning apparatus that cleans a substrate W, which has undergone dry etching, by use of a cleaning solution, such as a chemical solution or a rinse solution.

As shown in FIG. 1, the first substrate processing apparatus 2 includes a plurality of first load ports LP1 that hold a plurality of carriers C, respectively, in a state of being arranged in a horizontal arrangement direction D1, a single substrate processing type first processing module 7 that processes (dry-etches) substrates W carried out from the carrier C held by the first load port LP1, a first indexer module 6 that transfers substrates W between the first load port LP1, the first processing module 7, and the intermediate apparatus 3, and a first control device 8 that controls the operation of devices provided in the first substrate processing apparatus 2 or controls the opening and closing of valves. The first substrate processing apparatus 2 further includes a first inspection unit 9 that inspects a substrate W that has been processed by the first processing module 7. One example of the first inspection unit 9 is a unit that includes a scanning electron microscope that measures the line width of a pattern formed on the front surface of a substrate W that has been processed (i.e., a substrate W that has undergone dry etching).

As shown in FIG. 1, the first indexer module 6 includes a first indexer robot IR1 serving as a first transfer robot that transfers substrates W in a horizontal posture and a first indexer box 10 that contains the first indexer robot IR1 and the first inspection unit 9. The first indexer box 10 is connected to the first load port LP1, to the first processing module 7, and to the intermediate apparatus 3, and the first processing module 7 and the inside of the intermediate apparatus 3 are connected to the inside of the first indexer box 10. The first indexer robot IR1 carries substrates W into or out of the carrier C, the first processing module 7, the first inspection unit 9, and the intermediate apparatus 3, and substrates W are conveyed between the carrier C, the first processing module 7, the first inspection unit 9, and the intermediate apparatus 3.

The carrier C in which unprocessed substrates W (i.e., substrates W that have not yet been processed by the first substrate processing apparatus 2) are contained is placed on the first load port LP1 by means of the carrier transfer robot 5. A substrate W in the carrier C placed on the first load port LP1 is conveyed from the carrier C to the first processing module 7 through the inside of the first indexer box 10 by means of the first indexer robot IR1. Thereafter, the substrate W that has been processed by the first processing module 7 is conveyed from the first processing module 7 to the first indexer box 10 by means of the first indexer robot IR1. All processed substrates W are carried into the first inspection unit 9 one by one by means of the first indexer robot IR1, and are inspected one by one by means of the first inspection unit 9. Thereafter, the substrates W that have been processed and been inspected are conveyed to the carrier C held by the first load port LP1 or are conveyed to the intermediate apparatus 3 by means of the first indexer robot IR1. Furthermore, the carrier C in which the processed and already-inspected substrates W have been carried is conveyed from the first load port LP1 to the second substrate processing apparatus 4 by means of the carrier transfer robot 5.

As shown in FIG. 1 and FIG. 3, the intermediate apparatus 3 includes an upstream supporting member 11 that is capable of supporting a substrate W carried out of the first substrate processing apparatus 2 in a horizontal posture, a downstream supporting member 12 that is capable of supporting a plurality of substrates W carried into the second substrate processing apparatus 4 in a horizontal posture, an intermediate transfer robot R3 that conveys substrates W in a horizontal posture between the upstream supporting member 11 and the downstream supporting member 12, an intermediate box 14 that contains the upstream supporting member 11, the downstream supporting member 12, and the intermediate transfer robot R3, and an intermediate control device 13 that controls the operation of devices provided in the intermediate apparatus 3 and controls the opening and closing of a valve.

As shown in FIG. 1, the downstream supporting member 12 that functions as a buffer includes two supporting plates 12a that are capable of supporting the plurality of substrates W such that the substrates W are stacked together up and down with intervals therebetween in a horizontal posture. The two supporting plates 12a have a plurality of slots (shelves) disposed in the up-down direction with intervals therebetween. The two supporting plates 12a face each other with an interval therebetween in a horizontal orthogonal direction D2 perpendicular to the arrangement direction D1.

The downstream supporting member 12 is open toward the intermediate transfer robot R3 and toward the second substrate processing apparatus 4. A substrate W is conveyed by the intermediate transfer robot R3 to between the two supporting plates 12a through a space between the two supporting plates 12a.

As shown in FIG. 3, the intermediate box 14 includes an upstream box 15 connected to the first substrate processing apparatus 2, a downstream box 17 connected to the second substrate processing apparatus 4, and a box body 16 connected to the upstream box 15 and the downstream box 17. The intermediate apparatus 3 further includes an upstream shutter 18 that seals up an opening that connects the inside of the box body 16 and the inside of the downstream box 17 each other, a first opening-closing device that opens and closes the upstream shutter 18, a downstream shutter 19 that seals up an opening of the downstream box 17 connected to an opening (a direct carry-in entrance 25a) provided in the second substrate processing apparatus 4, a second opening-closing device that opens and closes the downstream shutter 19, and an exhaust duct 20 through which gases in the downstream box 17 are discharged.

The upstream shutter 18 is closed except when a substrate W is conveyed from the box body 16 to the downstream box 17. Likewise, the downstream shutter 19 is closed except when a substrate W is conveyed from the downstream box 17 to the second substrate processing apparatus 4. In a state in which the upstream shutter 18 and the downstream shutter 19 are closed, the inside of the downstream box 17 is isolated from the inside of the box body 16 and from the inside of the second substrate processing apparatus 4. In this state, when gases in the downstream box 17 are discharged through the exhaust duct 20, the inside of the downstream box 17 is depressurized. In a state in which the upstream shutter 18 and the downstream shutter 19 are closed, the atmospheric pressure in the downstream box 17 is lower than the atmospheric pressure in the first substrate processing apparatus 2 (than the atmospheric pressure in the first indexer module 6), and is maintained to have a value greater than the atmospheric pressure in the second substrate processing apparatus 4 (than the atmospheric pressure in a second indexer box 25 described later).

As shown in FIG. 1, a substrate W in the first substrate processing apparatus 2 is conveyed by the first indexer robot IR1 from the first substrate processing apparatus 2 to the upstream supporting member 11 through an opening (a direct carry-out exit 10a) that connects the inside of the first substrate processing apparatus 2 (the inside of the first indexer box 10) and the upstream box 15 together. A substrate W supported by the upstream supporting member 11 is conveyed by the intermediate transfer robot R3 in a horizontal posture from the upstream supporting member 11 to the downstream supporting member 12 in a state in which the upstream shutter 18 is opened. Thereafter, the substrate W supported by the downstream supporting member 12 is conveyed by a second indexer robot IR2 (described later) of the second substrate processing apparatus 4 from the downstream supporting member 12 to the second substrate processing apparatus 4 in a state in which the downstream shutter 19 is opened. As a result, the substrate W is conveyed from the first substrate processing apparatus 2 to the second substrate processing apparatus 4 through the intermediate apparatus 3.

As shown in FIG. 1, the second substrate processing apparatus 4 includes a plurality of second load ports LP2 that hold a plurality of carriers C, respectively, in a state of being arranged in the arrangement direction D1, a second processing module 23 that processes (cleans) a substrate W carried out from the carrier C held by the second load port LP2, a second indexer module 22 that conveys a substrate W between the carrier C held by the second load port LP2, the second processing module 23, and the intermediate apparatus 3, and a second control device 24 that controls the operation of devices provided in the second substrate processing apparatus 4 and controls the opening and closing of a valve.

As shown in FIG. 1, the second indexer module 22 includes the second indexer robot IR2 serving as a second transfer robot that transfers a substrates W in a horizontal posture and the second indexer box 25 that contains the second indexer robot IR2. The second indexer robot IR2, a second center robot CR2 described later, and a temporarily-holding unit 27 described later are an example of a second transfer unit.

The second indexer box 25 is connected to the second load port LP2, to the second processing module 23, and to the intermediate apparatus 3, and the second processing module 23 and the inside of the intermediate apparatus 3 are connected to the inside of the second indexer box 25. The direct carry-in entrance 25a through which the inside of the second indexer box 25 and the inside of the intermediate box 14 are connected together is sealed up by the downstream shutter 19, and is opened and closed by the downstream shutter 19. The second indexer robot IR2 carries a substrate W into or out of the carrier C, the second processing module 23, and the intermediate apparatus 3, and conveys the substrate W between the carrier C, the second processing module 23, and the intermediate apparatus 3.

As shown in FIG. 1 and FIG. 2, the second indexer robot IR2 is provided with two hands H disposed at mutually different heights. FIG. 1 shows a state in which the two hands H coincide with each other when viewed planarly. The second indexer robot IR2 moves the hands H in the horizontal direction and in the vertical direction. Additionally, the second indexer robot IR2 changes the direction of the hands H by rotating around the vertical axis (by rotating around its own axis). Still additionally, the second indexer robot IR2 moves in the arrangement direction D1 along a route passing through a receiving/delivering position (position shown in FIG. 1). The receiving/delivering position is a position at which the second indexer robot IR2 and the second processing module 23 (the temporarily-holding unit 27 described later) face each other in the orthogonal direction D2 when viewed planarly.

The second indexer robot IR2 allows the hands H to face an arbitrary carrier C placed on the second load port LP2 by moving the hands H in the horizontal direction and in the vertical direction. Likewise, the second indexer robot IR2 allows the hands H to face the second processing module 23 (the temporarily-holding unit 27 described later) or to face the intermediate apparatus 3 by moving the hands H in the horizontal direction and in the vertical direction. The second indexer robot IR2 carries a substrate W into or out of any one of the carrier C, the second processing module 23, and the intermediate apparatus 3 by moving the hands H in the horizontal direction and in the vertical direction in a state in which the hands H face any one of the carrier C, the second processing module 23, and the intermediate apparatus 3.

As shown in FIG. 1, the second processing module 23 is provided with a plurality of single substrate processing type second processing units MPC that process (clean) substrates W carried out of the carrier C by means of the second indexer module 22 one by one. FIG. 1 shows an example in which twelve second processing units MPC are disposed in the second processing module 23. The second processing module 23 is additionally provided with the second center robot CR2 that conveys a substrate W in a horizontal posture in the second processing module 23 and the temporarily-holding unit 27 that temporarily holds a substrate W conveyed from a carrier C held by the second load port LP2 or from the intermediate apparatus 3. The second indexer robot IR2, the second center robot CR2, and the temporarily-holding unit 27 are an example of the second transfer unit.

As shown in FIG. 1, the twelve second processing units MPC are disposed at four positions surrounding the second center robot CR2 when viewed planarly. The twelve second processing units MPC form four towers each of which includes three second processing units MPC stacked together up and down. The four towers form two rows arranged in the orthogonal direction D2 when viewed planarly. Two towers that form one of the two rows horizontally face two towers that form the other row, respectively, with intervals therebetween in the arrangement direction D1. The second center robot CR2 is disposed between the four towers in the arrangement direction D1. The temporarily-holding unit 27 is disposed between the receiving/delivering position of the second indexer robot IR2 and the second center robot CR2 when viewed planarly. The temporarily-holding unit 27 and the second center robot CR2 face each other in the orthogonal direction D2 when viewed planarly.

As shown in FIG. 2, the temporarily-holding unit 27 includes a relay unit 28 that relays a substrate W between the second indexer robot IR2 and the second center robot CR2 and an evacuation unit 29 that temporarily evacuates a substrate W carried out from the intermediate apparatus 3. The relay unit 28 and the evacuation unit 29 are arranged in the up-down direction, and coincide with each other when viewed planarly. FIG. 2 shows an example in which the relay unit 28 is disposed under the evacuation unit 29. The relay unit 28 may be disposed over the evacuation unit 29.

As shown in FIG. 1, the relay unit 28 includes one or more supporting members 30 that support a substrate W in a horizontal posture by coming into contact with the peripheral edge of the lower surface of the substrate W and a relay box 31 that contains a substrate W supported by the supporting member 30. The relay box 31 includes an opening that is open toward the second indexer robot IR2 and an opening that is open toward the second center robot CR2. The second indexer robot IR2 conveys a substrate W between the inside of the relay box 31 and the outside of the relay box 31 through the opening that is open toward the second indexer robot IR2. Likewise, the second center robot CR2 conveys a substrate W between the inside of the relay box 31 and the outside of the relay box 31 through the opening that is open toward the second center robot CR2.

As shown in FIG. 2, the evacuation unit 29 includes one or more supporting members 30 that support a substrate W in a horizontal posture by coming into contact with the peripheral edge of the lower surface of the substrate W and an evacuation box 32 that contains a substrate W supported by the supporting member 30. The evacuation box 32 includes an opening that is open toward the second indexer robot IR2 and an opening that is open toward the second center robot CR2. The second indexer robot IR2 conveys a substrate W between the inside of the evacuation box 32 and the outside of the evacuation box 32 through the opening that is open toward the second indexer robot IR2. Likewise, the second center robot CR2 conveys a substrate W between the inside of the evacuation box 32 and the outside of the evacuation box 32 through the opening that is open toward the second center robot CR2.

As shown in FIG. 1 and FIG. 2, the second center robot CR2 is provided with two hands H disposed at mutually different heights. FIG. 1 shows a state in which the two hands H coincide with each other when viewed planarly. The second center robot CR2 moves the hands H in the horizontal direction and in the vertical direction. Additionally, the second center robot CR2 changes the direction of the hands H by rotating around the vertical axis (by rotating around its own axis). A base portion of the second center robot CR2 is fixed to the second substrate processing apparatus 4, and is immovable to the second substrate processing apparatus 4. The second center robot CR2 may be movable in the orthogonal direction D2.

The second center robot CR2 allows the hands H to face an arbitrary second processing unit MPC by moving the hands H in the horizontal direction and in the vertical direction. Likewise, the second center robot CR2 allows the hands H to face the relay unit 28 or the evacuation unit 29 by moving the hands H in the horizontal direction and in the vertical direction. The second center robot CR2 carries a substrate W into or out of any one of the second processing unit MPC, the relay unit 28, and the evacuation unit 29 by moving the hands H in the horizontal direction and in the vertical direction in a state in which the hands H face any one of the second processing unit MPC, the relay unit 28, and the evacuation unit 29.

The carrier C in which unprocessed substrates W (substrates W that have not yet been processed by the second substrate processing apparatus 4) are contained is placed on the second load port LP2 by means of the carrier transfer robot 5. A substrate W in the carrier C placed on the second load port LP2 is conveyed from the inside of the carrier C to the inside of the second indexer box 25 by means of the second indexer robot IR2. Thereafter, the substrate W that has been conveyed into the second indexer box 25 is conveyed from the inside of the second indexer box 25 to the inside of the relay box 31 by means of the second indexer robot IR2, and is placed on the supporting member 30 of the relay unit 28. The substrate W supported in a horizontal posture by means of the relay unit 28 is conveyed from the inside of the relay box 31 to the inside of the second processing unit MPC by means of the second center robot CR2, and is processed (cleaned) by the second processing unit MPC. Thereafter, the already-processed substrate W is conveyed from the second processing unit MPC to the relay unit 28 by means of the second center robot CR2, and is conveyed from the relay unit 28 to the carrier C held by the second load port LP2 by means of the second indexer robot IR2.

An unprocessed substrate W (a substrate W that has not yet been processed by the second substrate processing apparatus 4) supported by the downstream supporting member 12 of the intermediate apparatus 3 is conveyed from the inside of the intermediate apparatus 3 to the inside of the second indexer box 25 by means of the second indexer robot IR2 in a state in which the downstream shutter 19 is opened. Thereafter, the substrate W that has been conveyed into the second indexer box 25 is conveyed from the inside of the second indexer box 25 to the inside of the relay box 31 or to the inside of the evacuation box 32 by means of the second indexer robot IR2, and is placed on the supporting member 30 in the relay box 31 or in the evacuation box 32. The substrate W that has been conveyed into the evacuation box 32 is conveyed to the carrier C held by the second load port LP2 from the evacuation unit 29 by means of the second indexer robot IR2 without being conveyed via the second processing unit MPC. The substrate W that has been conveyed into the relay box 31 is conveyed from the inside of the relay box 31 to the inside of the second processing unit MPC by means of the second center robot CR2, and is processed by the second processing unit MPC. Thereafter, the already-processed substrate W is conveyed from the second processing unit MPC to the relay unit 28 by means of the second center robot CR2, and is conveyed to the carrier C held by the second load port LP2 from the relay unit 28 by means of the second indexer robot IR2.

Figure 4:
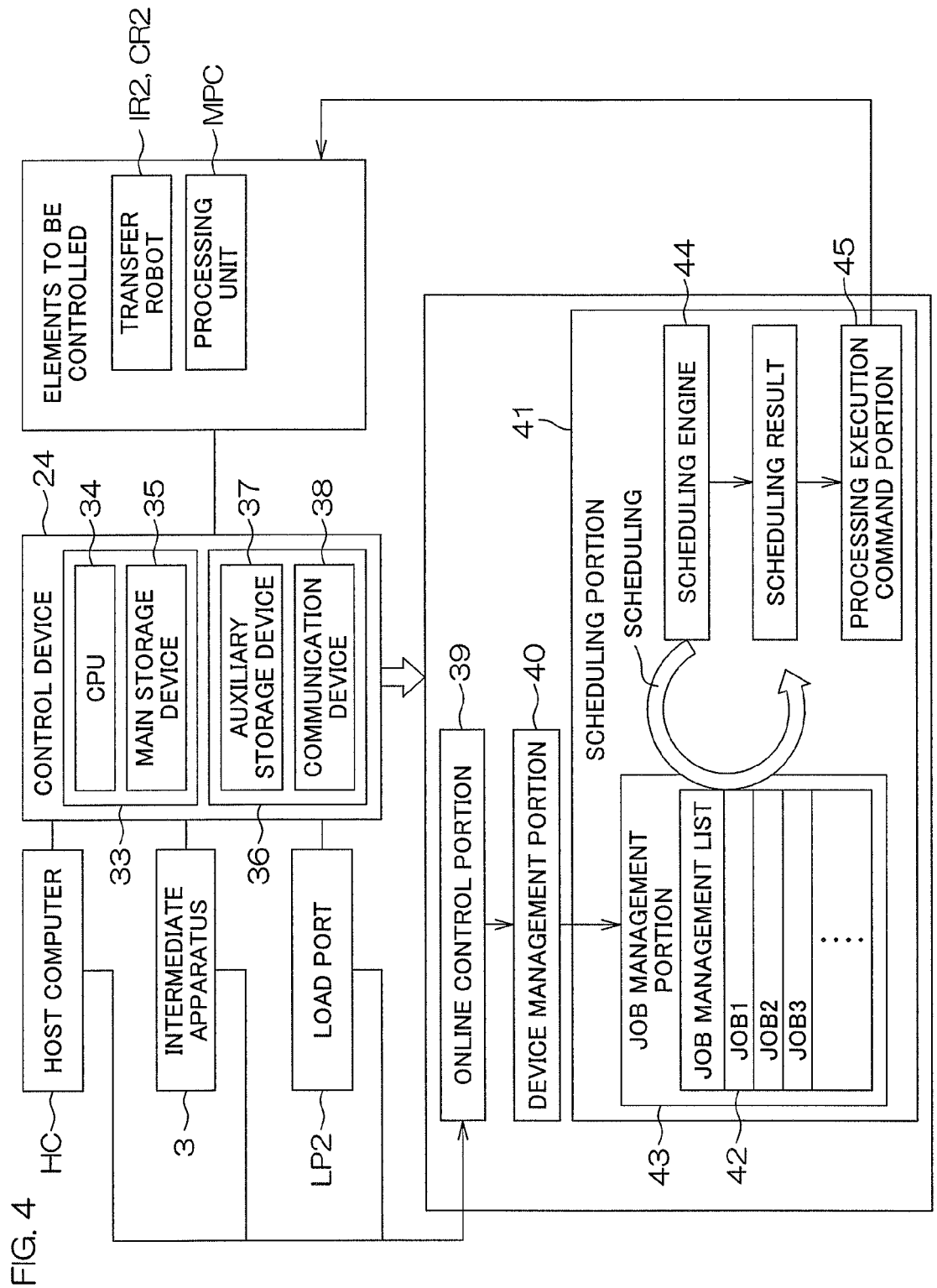
FIG. 4 is a block diagram to describe an electric arrangement of the second substrate processing apparatus 4.

FIG. 4 is a block diagram to describe an electric arrangement of the second substrate processing apparatus 4.

As shown in FIG. 4, the second control device 24 is connected to a plurality of devices, such as the intermediate apparatus 3 and the second load port LP2, that are provided in the second substrate processing apparatus 4. The second control device 24 is further connected to devices, such as a host computer HC, excluding the second substrate processing apparatus 4. The second control device 24 includes a computer body 33 and a peripheral device 36 connected to the computer body 33. The computer body 33 includes a CPU (central processing unit) 34 that executes programs and a main storage device 35 connected to the CPU 34. The peripheral device 36 includes an auxiliary storage device 37 connected to the main storage device 35 and a communication device 38 that communicates with the host computer HC and so on.

As shown in FIG. 4, the second control device 24 includes an online control portion 39 that communicates with a plurality of devices, such as the host computer HC, the intermediate apparatus 3, and the second load port LP2, a device management portion 40 that relays a command transmitted to the online control portion 39, and a scheduling portion 41 that creates a schedule to convey and/or process a substrate W in accordance with a command sent from the device management portion 40 and that operates a resource of the second substrate processing apparatus 4 in accordance with the created schedule. The online control portion 39, the device management portion 40, and the scheduling portion 41 are a functional block realized by allowing the CPU 34 to execute programs stored in the auxiliary storage device 37.

As shown in FIG. 4, the scheduling portion 41 includes a job management portion 43 that manages a job management list 42 in which the identification information of jobs correlated to substrates W carried into the second substrate processing apparatus 4 is registered in accordance with a predetermined priority, a scheduling engine 44 that creates a schedule to convey and/or process substrates W correlated to jobs registered in the job management list 42 in order from a job having the highest priority among the jobs, and a processing execution command portion 45 that allows the resource of the second substrate processing apparatus 4 to execute the conveyance and/or the processing of a substrate W by operating the resource of the second substrate processing apparatus 4 in accordance with a plan (scheduling result) created by the scheduling engine 44.

The auxiliary storage device 37 stores a plurality of pieces of substrate processing information (hereinafter, referred to as "recipe") that define the contents of substrate processing. The recipe includes identification information, substrate processing conditions, and substrate processing procedures. In more detail, the recipe includes concurrent processing unit information, to-be-used processing liquid information, processing time information, etc. The concurrent processing unit information is information that specifies second processing units MPC that are usable, and shows that concurrent processing can be performed by second processing units MPC that have been specified. In other words, when one of the specified processing units is unusable, this state shows that it is replaceable by the other specified processing units. The term "when a processing unit is unusable" denotes the time when the second processing unit MPC is in use for processing another substrate W, the time when the second processing unit MPC is in trouble, the time when an operator does not want the processing of a substrate W by means of the second processing unit MPC, and so on.

As described later, identification information of a recipe is transmitted to the second control device 24 from the host computer HC. The scheduling portion 41 selects a recipe corresponding to the identification information of the recipe transmitted from the host computer HC from among a plurality of recipes stored in the auxiliary storage device 37, and reads the recipe selected therefrom. Thereafter, the scheduling portion 41 creates a schedule to process the substrate W in accordance with a substrate processing condition and a substrate processing procedure included in the read recipe, and allows the resource of the second substrate processing apparatus 4 to execute a created schedule. As a result, a plurality of substrate processing steps (for example, a processing liquid supplying step and a drying step) are performed under substrate processing conditions specified by the recipe and in a substrate processing procedure specified by the recipe.

Figure 5:
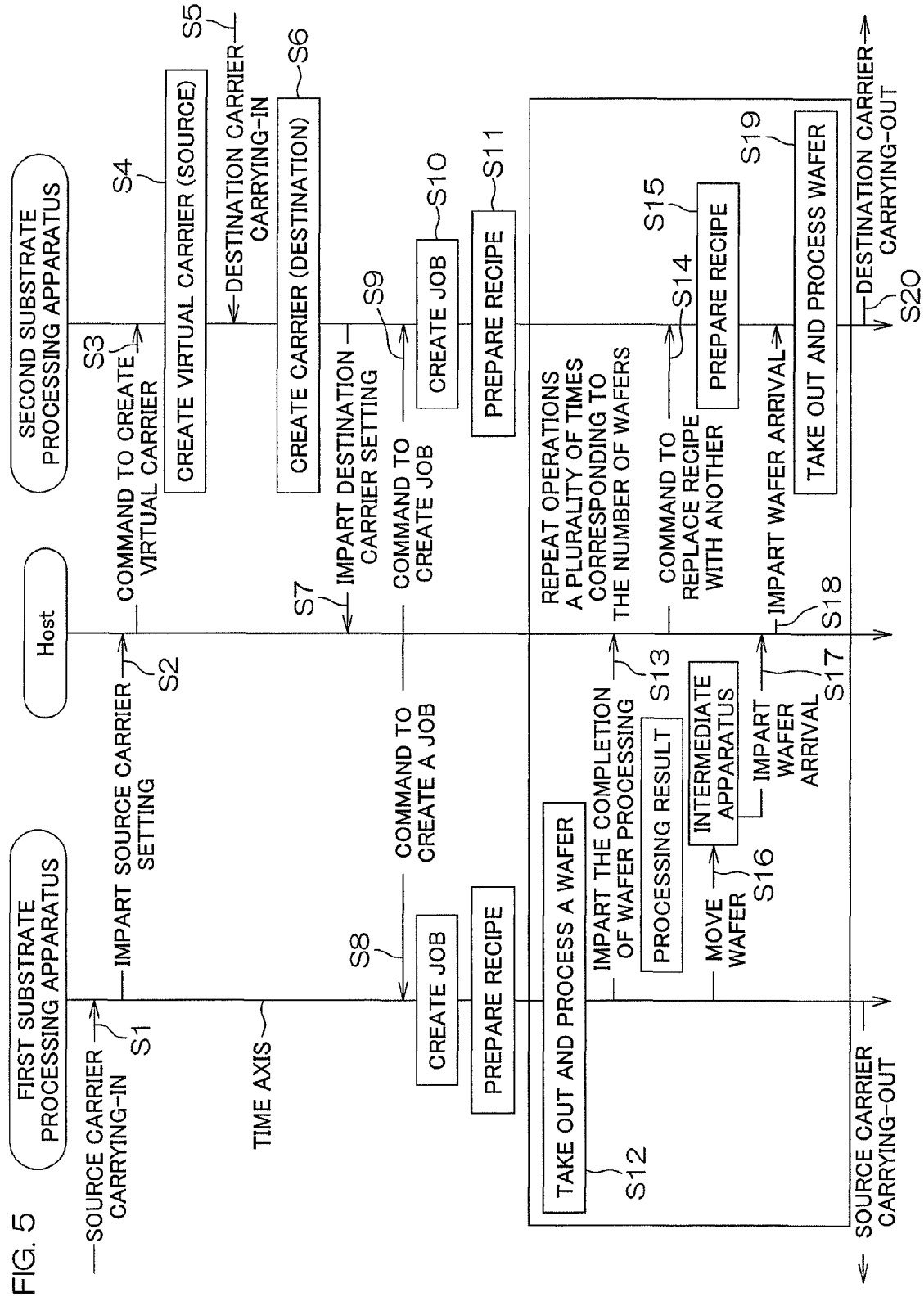
FIG. 5 is a flowchart when a substrate W is processed by a first substrate processing apparatus 2 and the second substrate processing apparatus 4.

FIG. 5 is a flowchart when a substrate W is processed by the first substrate processing apparatus 2 and by the second substrate processing apparatus 4.

When a carrier C in which an unprocessed substrate W (a substrate W that has not yet been processed by the first substrate processing apparatus 2) is contained is placed on the first load port LP1 by means of the carrier transfer robot 5 (step S1), the first control device 8 of the first substrate processing apparatus 2 transmits first carrier setting information to the host computer HC (step S2), and imparts the fact that a carrier C has been set up to the host computer HC. The first carrier setting information includes identification information of the first carrier C, identification information of the first load port LP1 in which the first carrier C has been set up, and first slot information that shows the position of a slot into which a substrate W has been inserted among a plurality of slots of the first carrier C. Therefore, the information that an unprocessed substrate W is disposed at "any one of the slots" of "any one of the carriers" placed on "any one of the first load ports LP1" is recognized by the host computer HC, i.e., positional information of a specific substrate W is recognized by the host computer HC.

When the fact that the carrier C has been set up is imparted from the first control device 8, the host computer HC transmits a command to create a first virtual carrier to the second control device 24 (step S3), and commands the second control device 24 to create a first virtual carrier corresponding to the first carrier C that has been set up at the first load port LP1, i.e., corresponding to a carrier that does not exist in the second substrate processing apparatus 4. The second control device 24 receives the command to create the first virtual carrier from the host computer HC, and creates the first virtual carrier (logical information) in the second control device 24 (step S4). The command to create the first virtual carrier includes identification information of the first carrier C, identification information of the first load port LP1 on which the first carrier C has been set up, and first slot information that shows the position of a slot into which a substrate W has been inserted among a plurality of slots of the first carrier C. In other words, information that is the same as the first carrier setting information is included in the first virtual carrier creation information.

On the other hand, when a second carrier C for containing a substrate W processed by the second substrate processing apparatus 4 is placed on the second load port LP2 by means of the carrier transfer robot 5 (step S5), the second control device 24 creates a second virtual carrier corresponding to the second carrier C on the second load port LP2, i.e., corresponding to a carrier that exists in the second substrate processing apparatus 4 in the second control device (step S6). Furthermore, the second control device 24 transmits second carrier setting information to the host computer HC (step S7), and imparts the fact that the second carrier C has been set up to the host computer HC. The second carrier setting information includes identification information of the second carrier C, identification information of the second load port LP2 on which the second carrier C has been set up, and second slot information (slot map) that shows the position of a slot in which a substrate W is not inserted among a plurality of slots of the second carrier C.

As described later, the second control device 24 creates a schedule to convey a substrate W from the first virtual carrier to the second virtual carrier in the second control device 24, and allows the second substrate processing apparatus 4 to execute this schedule.

When the first carrier setting information and the second carrier setting information are received by the host computer HC, the host computer HC transmits a first job creation command to the first control device 8 (step S8), and commands the first control device 8 to create a job. The first job creation command includes identification information of a job, identification information of a recipe, identification information of a carrier (herein, a first carrier C) that contains substrates W to be processed, first slot information that shows any one of the slots of this carrier in which the substrate W has been inserted, identification information of a carrier (herein, a second carrier C) that contains already-processed substrates W, and second slot information that shows any one of the slots of this carrier into which the substrate W should be inserted.

Likewise, when the first carrier setting information and the second carrier setting information are received by the host computer HC, the host computer HC transmits a second job creation command (PJ•CJCreate) to the second control device 24 (step S9), and commands the second control device 24 to create a job. The second job creation command includes identification information of a job, identification information of a recipe, identification information of a departure carrier (herein, a first carrier C) that contains substrates W to be processed, first slot information that shows any one of the slots of the carrier in which the substrate W has been inserted, identification information of a target carrier (herein, a second carrier C) that contains already-processed substrates W, and second slot information that shows any one of the slots of the carrier into which the substrate W should be contained.

When a second job creation command transmitted from the host computer HC is received by the second control device 24, the second control device 24 creates a plurality of PJs (process jobs) correlated to a plurality of substrates W, respectively, and a CJ (control job) correlated to a plurality of PJs in the second control device 24 (step S10). For example, when "1" and "2" are specified for two substrates W in the second job creation command as pieces of job identification information, respectively, the second control device 24 creates a PJ1 and a PJ2 that correspond to the two substrates W, respectively, and a CJ corresponding to the PJ1 and the PJ2 in the second control device 24.

Each PJ includes identification information of a recipe specified by a second job creation command. There is a case in which substrates W are mutually different in the contents of a recipe or are the same as each other therein. The second control device 24 selects a recipe corresponding to the identification information of a recipe specified by a job (PJ) from among a plurality of recipes stored in the auxiliary storage device 37, and loads the selected recipe into the main storage device 35. As a result, recipes corresponding to a plurality of substrates W are prepared by the second control device 24 (step S11).

On the other hand, the CJ includes identification information of a departure carrier, first slot information of a departure carrier, identification information of a target carrier, and second slot information of a target carrier. These pieces of information are ones specified by a second job creation command. The second control device 24 creates a schedule so that a plurality of substrates W corresponding to a plurality of PJs, respectively, each of which corresponds to a shared CJ are conveyed from a departure carrier (first virtual carrier) specified by the CJ to a target carrier (second virtual carrier) specified by the CJ, and the second control device 24 allows the second substrate processing apparatus 4 to perform a created schedule.

In the second job creation command, the first carrier C disposed at the first substrate processing apparatus 2 is specified as a departure carrier. On the other hand, in the second job creation command, the second carrier C disposed at the second substrate processing apparatus 4 is specified as a target carrier. Therefore, in the second job creation command, the second substrate processing apparatus 4 is commanded to convey substrates W to the second carrier C disposed at the second substrate processing apparatus 4 from the first carrier C disposed at the first substrate processing apparatus 2 that is an apparatus differing from the second substrate processing apparatus 4.

The first control device 8 allows a resource, such as the first indexer module 6 or the first processing module 7, that is provided in the first substrate processing apparatus 2 to convey a substrate W contained in the first carrier C held by the first load port LP1 to the first processing module 7, and allows the first processing module 7 to process the substrate W (step S12). Thereafter, the already-processed substrate W is inspected by the first inspection unit 9, and then the first control device 8 allows the resource of the first substrate processing apparatus 2 to convey the substrate W to the intermediate apparatus 3. If a plurality of substrates W are contained in the first carrier C, the first control device allows the resource of the first substrate processing apparatus 2 to repeatedly perform these operations. When the processing and the inspection of the substrates W are completed, the first control device 8 furthermore transmits first processing result information to the host computer HC with respect to each substrate W (step S13), and informs the host computer HC of the fact that the processing and the inspection of the substrates W have been completed. The first processing result information includes inspection information that shows inspection results in the first inspection unit 9.

When the first processing result information is received by the host computer HC, the host computer HC selects identification information of a recipe corresponding to the inspection information. Thereafter, the host computer HC transmits a recipe replacement command including the identification information of the selected recipe to the second control device 24 (step S14), and allows the second control device 24 to change the identification information of the present recipe specified by a job (PJ) to the identification information of the selected recipe. Therefore, the second control device 24 selects a recipe corresponding to the identification information of the replaced recipe from among a plurality of recipes stored in the auxiliary storage device 37, and loads the selected recipe into the main storage device 35. As a result, the contents of a recipe that has already been prepared is replaced with the contents of another recipe, and a recipe that reflects inspection results is prepared by the second control device 24 for each substrate W (step S15).

If a plurality of substrates W are contained in the first carrier C set up at the first load port LP1, the first control device 8 allows the first indexer robot IR1 to convey a plurality of substrates W that have been processed and inspected from the first substrate processing apparatus 2 to the upstream supporting member 11 of the intermediate apparatus 3 one by one. The intermediate control device 13 allows the intermediate transfer robot R3 to convey a substrate W placed on the upstream supporting member 11 by means of the first indexer robot IR1 to any one of the slots of the downstream supporting member 12 (step S16). When the intermediate transfer robot R3 inserts the substrate W into any one of the slots of the downstream supporting member 12, the intermediate control device 13 transmits substrate arrival information to the host computer HC (step S17), and informs the host computer HC of the fact that the substrate W has arrived near the second substrate processing apparatus 4. The substrate arrival information includes identification information of the downstream supporting member 12 and first slot information that shows any one of the slots of the downstream supporting member 12 in which a substrate W has been inserted.

When the substrate arrival information is received by the host computer HC, the host computer HC transmits the substrate arrival information to the second control device 24 (step S18), and imparts the fact that the substrate W has arrived at a place within a conveyable range to which the second indexer robot IR2 is capable of conveying a substrate W to the second control device 24. As described above, the substrate arrival information includes identification information of the downstream supporting member 12 and first slot information that shows any one of the slots of the downstream supporting member 12 in which a substrate W has been inserted. When the substrate arrival information is received by the second control device 24, the second control device 24 changes the first virtual carrier (logical information) held by the second control device 24. More specifically, existing information (positional information corresponding to the first carrier C on the first load port LP1) included in the first virtual carrier is replaced with the identification information of the upstream supporting member 11 and with the first slot information that shows the position of a slot in which a substrate W has been inserted among the slots disposed at the upstream supporting member 11. Therefore, the second job creation command transmitted from the host computer HC to the second control device 24 is changed so that the substrate W is conveyed to the second carrier C held by the second load port LP2 from the upstream supporting member 11 of the intermediate apparatus 3 that is an apparatus differing from the second substrate processing apparatus 4.

As described later, the second control device 24 conveys a substrate W, which has been conveyed to the intermediate apparatus 3, to the second processing module 23, and creates a schedule to convey the substrate W processed by the second processing module 23 to a carrier C held by the second load port LP2 for each substrate W. Thereafter, the second control device 24 allows the resource, such as the second indexer module 22 or the second processing module 23, provided in the second substrate processing apparatus 4 to execute the schedule (step S19). Therefore, the substrate W processed by the first substrate processing apparatus 2 is conveyed from the first substrate processing apparatus 2 to the second substrate processing apparatus 4 through the intermediate apparatus 3. In other words, the substrate W is not conveyed by the carrier transfer robot 5 in a state of being contained in the carrier C, but is conveyed from the first substrate processing apparatus 2 to the second substrate processing apparatus 4 by means of the first substrate processing apparatus 2, the second substrate processing apparatus 4, and the intermediate apparatus 3. Thereafter, the substrate W conveyed to the second substrate processing apparatus 4 is processed by the second substrate processing apparatus 4, and then is contained in the second carrier C held by the second load port LP2. Thereafter, the second carrier C in which the already-processed substrate W is contained is conveyed by the carrier transfer robot 5 to a substrate processing apparatus that performs subsequent steps (step S20).

Figure 6:
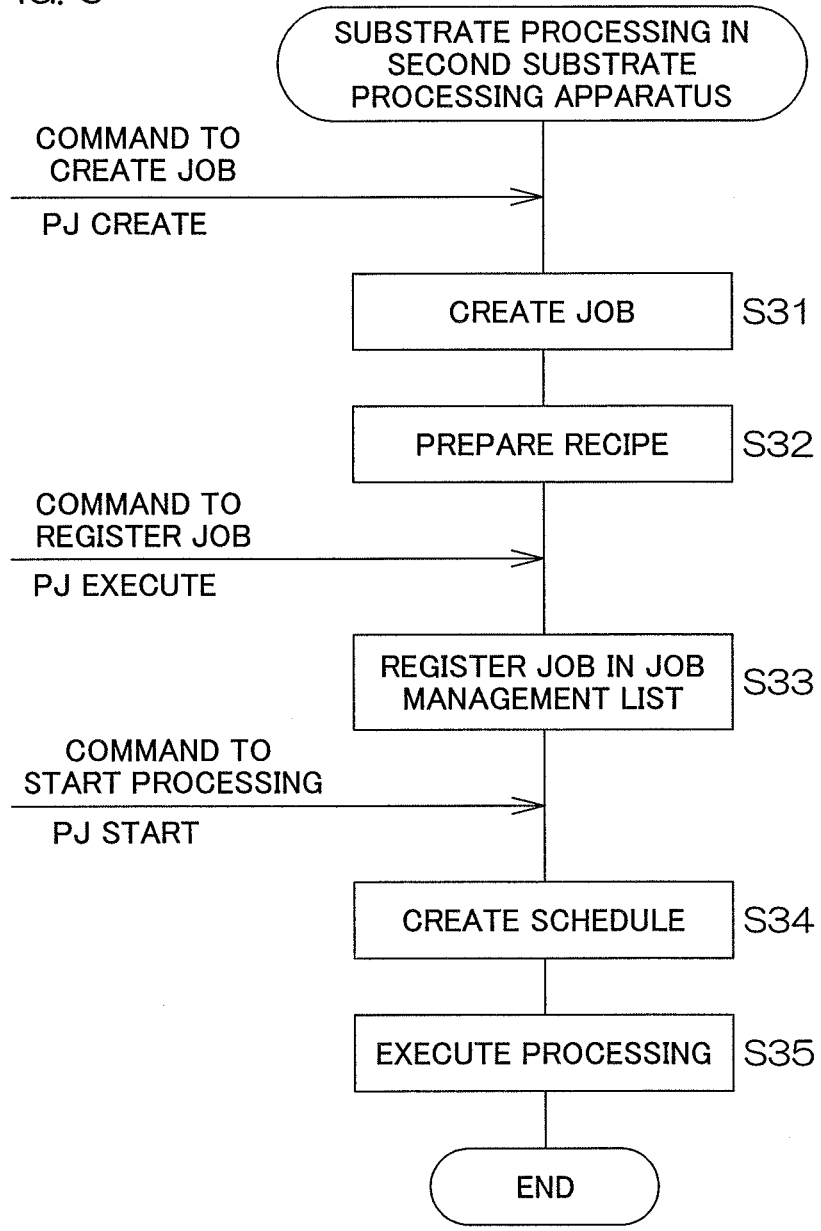
FIG. 6 is a flowchart until a substrate W is processed by the second substrate processing apparatus 4 from the creation of a job in the second substrate processing apparatus 4.

FIG. 6 is a flowchart until a substrate W is processed by the second substrate processing apparatus 4 from the creation of a job in the second substrate processing apparatus 4.

As described above, when a job creation command (PJCreate) is transmitted to the second control device 24 from the host computer HC, the second control device 24 creates a job (for example, PJ1 or PJ2) in which substrates W are different from each other in identification number (step S31), and a recipe corresponding to the identification information of a recipe specified by the job creation command is prepared by reading it from the auxiliary storage device 37 (step S32).

When a plurality of job registration commands (PJExecute) that correspond to a plurality of PJs, respectively, are transmitted to the second control device 24 from the host computer HC, the second control device 24 determines the priority of the PJs in accordance with job priority determination control described later, and registers the PJs specified by the job registration commands in the job management list 42 in accordance with the priority (step S33).

When a plurality of processing start commands (PJStart) corresponding to a plurality of PJs are transmitted to the second control device 24 from any one of the intermediate apparatus 3, the second load port LP2, and the host computer HC, the second control device 24 creates a schedule to convey and/or process substrates W by means of the second substrate processing apparatus 4 in accordance with the order that is registered in the job management list 42 for each substrate W (step S34). Thereafter, the second control device 24 allows a resource, such as the second indexer module 22 or the second processing module 23, provided in the second substrate processing apparatus 4 to execute this schedule (step S35).

An example of schedules created by the second control device 24 is a schedule to convey a substrate W contained in a carrier C held by the second load port LP2 to the second processing unit MPC through the relay unit 28 and to convey the substrate W processed by the second processing unit MPC to the carrier C held by the second load port LP2 through the relay unit 28. In other words, in this schedule, the substrate W is conveyed from a position in the second substrate processing apparatus 4 to a position in the second substrate processing apparatus 4 (i.e., a position that is the same as or is different from the initial position).

Another example of schedules created by the second control device 24 is a schedule to convey a substrate W held by the intermediate apparatus 3 to the second processing unit MPC through the relay unit 28 and to convey the substrate W processed by the second processing unit MPC to the carrier C held by the second load port LP2 through the relay unit 28. In other words, in this schedule, the substrate W is conveyed from a position in an apparatus (the intermediate apparatus 3) differing from the second substrate processing apparatus 4 to a position in the second substrate processing apparatus 4.

Still another example of schedules created by the second control device 24 is a schedule to convey a substrate W held by the intermediate apparatus 3 to the evacuation unit 29 and to convey the substrate W contained in the evacuation unit 29 to the carrier C held by the second load port LP2 from the evacuation unit 29 without processing the substrate W by means of the second processing unit MPC. In other words, in this schedule, the substrate W is conveyed from a position at which an apparatus (the intermediate apparatus 3) differing from the second substrate processing apparatus 4 is placed to a position at which the second substrate processing apparatus 4 is placed.

FIG. 7 is a flowchart to describe job priority determination control.

An example will be hereinafter described in which the second control device 24 creates or changes the job management list 42 so that a PJ (hereinafter, referred to as a "second PJ") corresponding to a substrate W conveyed from the first substrate processing apparatus 2 to the second substrate processing apparatus 4 through the intermediate apparatus 3 takes precedence over a PJ (hereinafter, referred to as a "first PJ") corresponding to a substrate W contained in a carrier C placed on the second load port LP2.

Job registration commands (PJExecute) are transmitted to the second control device 24 for each PJ. The job registration command of a first PJ is transmitted after the time when a carrier C is placed at the second load port LP2. The job registration command of a second PJ is transmitted after a recipe specified at the beginning in the second PJ is replaced with a recipe that reflects an inspection result and after the positional information of a substrate W correlated to the second PJ is changed to any one of the slots of the downstream supporting member 12.

The second control device 24 confirms whether a job registration command has been transmitted (step S51). When the job registration command is transmitted to the second control device 24 from the host computer HC (Yes in step S51), the second control device 24 determines whether a PJ required to be registered in the job management list 42 is the first PJ or the second PJ (step S52).

If the PJ required to be registered is the first PJ (No in step S52), the second control device 24 registers the PJ required to be registered at the end of the job management list 42. More specifically, if another PJ (at least one of the first PJ and the second PJ) has already been registered in the job management list 42, the second control device 24 registers a new PJ behind all registered PJs. If a registered PJ is not present in the job management list 42, the second control device 24 registers a new PJ at the top of the job management list 42 corresponding to its end at this time (step S53).

On the other hand, if the PJ required to be registered is the second PJ (Yes in step S52), the second control device 24 determines whether the PJ has already been registered in the job management list 42 (step S54). If a registered PJ is not present in the job management list 42 (Yes in step S54), the second control device 24 registers the PJ required to be registered at the top of the job management list (step S55). If a registered PJ is present in the job management list 42 (No in step S54), the second control device 24 determines whether the registered PJ is the first PJ or the second PJ (step S56).

If all registered PJs are the first PJs (No in step S56), the second control device 24 registers the second PJ required to be registered in front of all registered first PJs, and changes the job management list 42 so that the second PJ takes precedence over all first PJs (step S57).

If one or more second PJs are included in the registered PJs (Yes in step S56), the second control device 24 changes the job management list 42 so that all registered second PJs take precedence over new second PJs and so that the new second PJs take precedence over all first PJs.

More specifically, if the registered PJs are all the second PJs (Yes1 in step S56), the second control device 24 registers the new second PJs at the end of the job management list 42 (step S58). If a first PJ and a second PJ have already been registered in the job management list 42 (Yes2 in step S56), the second control device 24 registers the new second PJ behind the second PJ registered at the end (which is the lowest in priority), and makes the priority of all registered first PJs lower than the newly registered second PJ (step S59).

FIG. 8A to FIG. 8D are lists, each showing created PJs and registered PJs.

In FIG. 8A to FIG. 8D, the first PJ is represented as any one of PJ1 to PJ20, and the second PJ is represented as either one of PJA and PJB. Additionally, in FIG. 8A to FIG. 8D, the status of a registered PJ is represented as any one of "Disbursement Stop," "Stop Release," and "Being Processed." "Disbursement Stop" denotes a status before the second control device 24 receives a processing start command (PJStart) of the PJ. "Stop Release" denotes a status before the second control device 24 starts the scheduling of a substrate W commanded to start processing after the second control device 24 receives the processing start command of the PJ. "Being Processed" denotes a status after a substrate W starts being conveyed from the carrier C or from the intermediate apparatus 3 during the execution of a schedule.

FIG. 8A shows a job management list 42 after job registration commands of ten first PJs (PJ1 to PJ10) are successively sent to the second control device 24 and processing start commands of the ten first PJs are successively sent to the second control device 24 when registered PJs are not present in the job management list 42. In this case, as shown in FIG. 8A, PJ1 to PJ10 are registered in the job management list 42 in this order from the top thereamong. Additionally, the status of each first PJ has been changed to "Stop Release" because the processing start commands of the ten first PJs have been sent to the second control device 24.

FIG. 8B shows a job management list 42 after the job registration command and the processing start command of one second PJ are sent to the second control device 24 when ten first PJs are registered in the job management list 42. In this case, the second control device 24 changes the job management list 42 so that the second PJ required to be registered is registered in front of all registered first PJs and so that the second PJ takes precedence over all first PJs because all PJs registered before the second PJ is required to be registered are the first PJs. Additionally, the status of the second PJ has been changed to "Stop Release" because the processing start command of the second PJ has been sent to the second control device 24. With respect to the ten registered first PJs, the statuses of five PJs, i.e., PJ1 to PJ5 that are from the top higher in priority to the fifth have been changed to "Being Processed," and five substrates W corresponding to PJ1 to PJ5, respectively, have started being conveyed.

FIG. 8C shows a job management list 42 after the job registration command and the processing start command of one second PJ are sent to the second control device 24 when ten first PJs and one second PJ are registered in the job management list 42. In this case, the second control device 24 changes the job management list 42 so that a new second PJ (PJB) is disposed between the registered second PJ (PJA) and the ten registered first PJs (PJ1 to PJ10) and so that the registered second PJ takes precedence over the new second PJ and so that the new second PJ takes precedence over the ten registered first PJs.

FIG. 8D shows a job management list 42 after the job registration commands of ten first PJs (PJ11 to PJ20) are successively sent to the second control device 24 when the ten first PJs and two second PJs are registered in the job management list 42. In this case, the second control device 24 successively registers the new ten first PJs (PJ11 to PJ20) behind all registered PJs because the ten first PJs and the two second PJs have already been registered in the job management list 42.

The plurality of PJs are registered in the job management list 42 in such a manner as described above (step S33 of the flowchart of FIG. 6). Thereafter, when a plurality of processing start commands (PJStart) corresponding to a plurality of PJs, respectively, are transmitted to the second control device 24 from any one of the intermediate apparatus 3, the second load port LP2, and the host computer HC, the second control device 24 creates a schedule to convey and/or process substrates W for each substrate W by means of the second substrate processing apparatus 4 in accordance with the order registered in the job management list 42. Thereafter, scheduling is executed to allocate each element of each schedule to each resource of the second substrate processing apparatus 4 so that the substrates W do not interfere with each other (step S34 of FIG. 6).

After the scheduling is completed, the second control device 24 allows the resource provided in the second substrate processing apparatuses 4, such as the second indexer module 22 or the second processing module 23, to execute the conveyance and/or the processing of the substrates W in accordance with the schedule created in step S34 (step S35 of FIG. 6).

Although an example has been described in which scheduling is set up so that the PJ of the second schedule always takes precedence over the PJ of the first schedule as has been described with reference to FIG. 7 and FIGS. 8A to 8D, it is also possible not to set up scheduling so that the PJ of the second schedule always takes precedence over the PJ of the first schedule.

Figure 10:
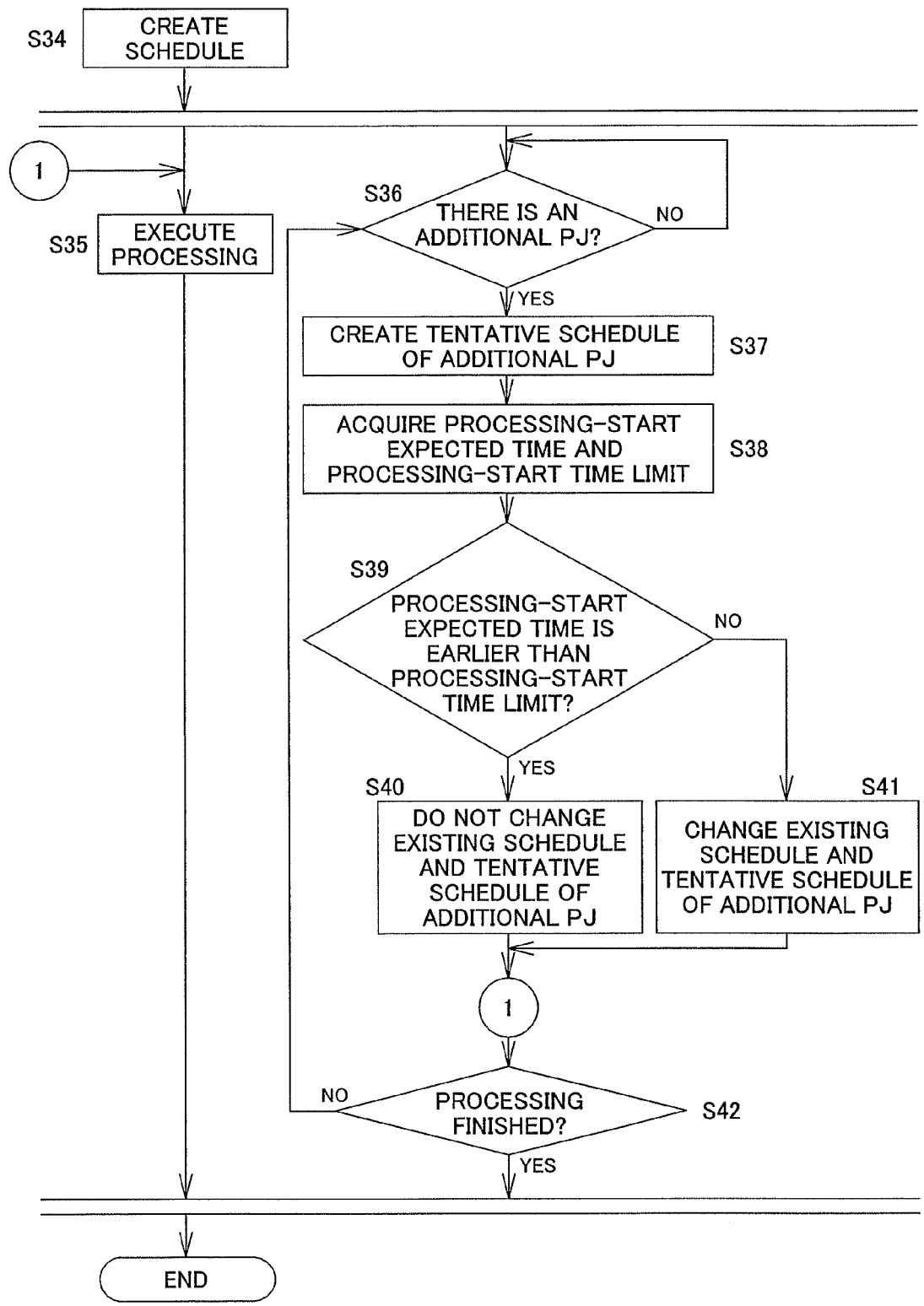
FIG. 10 is a flowchart showing whether the first schedule and the second schedule are needed or not.

However, if so, there is a possibility that a relationship between the existing first schedule and the additional second schedule will become problematic when the second schedule is added while the second control device 24 is conveying and/or processing a substrate W (step S35 of FIG. 6) in accordance with the first schedule. FIG. 10 is a flowchart more specifically showing a relationship between a schedule creating step (step S34) and a processing execution step (step S35) shown in FIG. 6 in a case in which scheduling is set up so that the additional second schedule does not necessarily take precedence over the first schedule when jobs are registered in the job management list (step S33 of FIG. 6).

In detail, as shown in FIG. 10, the second control device 24 creates a first schedule correlated to a plurality of PJs (step S34), and then the second control device 24 successively executes processing in accordance with the first schedule (step S35). In parallel with this processing execution step (step S35), the second control device 24 monitors the presence or absence of additional PJs (step S36). If an additional PJ occurs (Yes in step S36), the second control device 24 creates a tentative schedule correlated to the additional PJ (step S37), and then examines a relationship between the existing schedule and the schedule correlated to the additional PJ, and takes necessary measures (step S38 to step S41).

It should be noted that the process of from step S36 to step S41 is performed in parallel with step S35 until the substrate-conveying and/or substrate-processing step (step S35) is finished by the second substrate processing apparatus 4 (step S42).

The process of from step S36 to step S41 will be described in detail by use of a specific example.

Figure 9A:
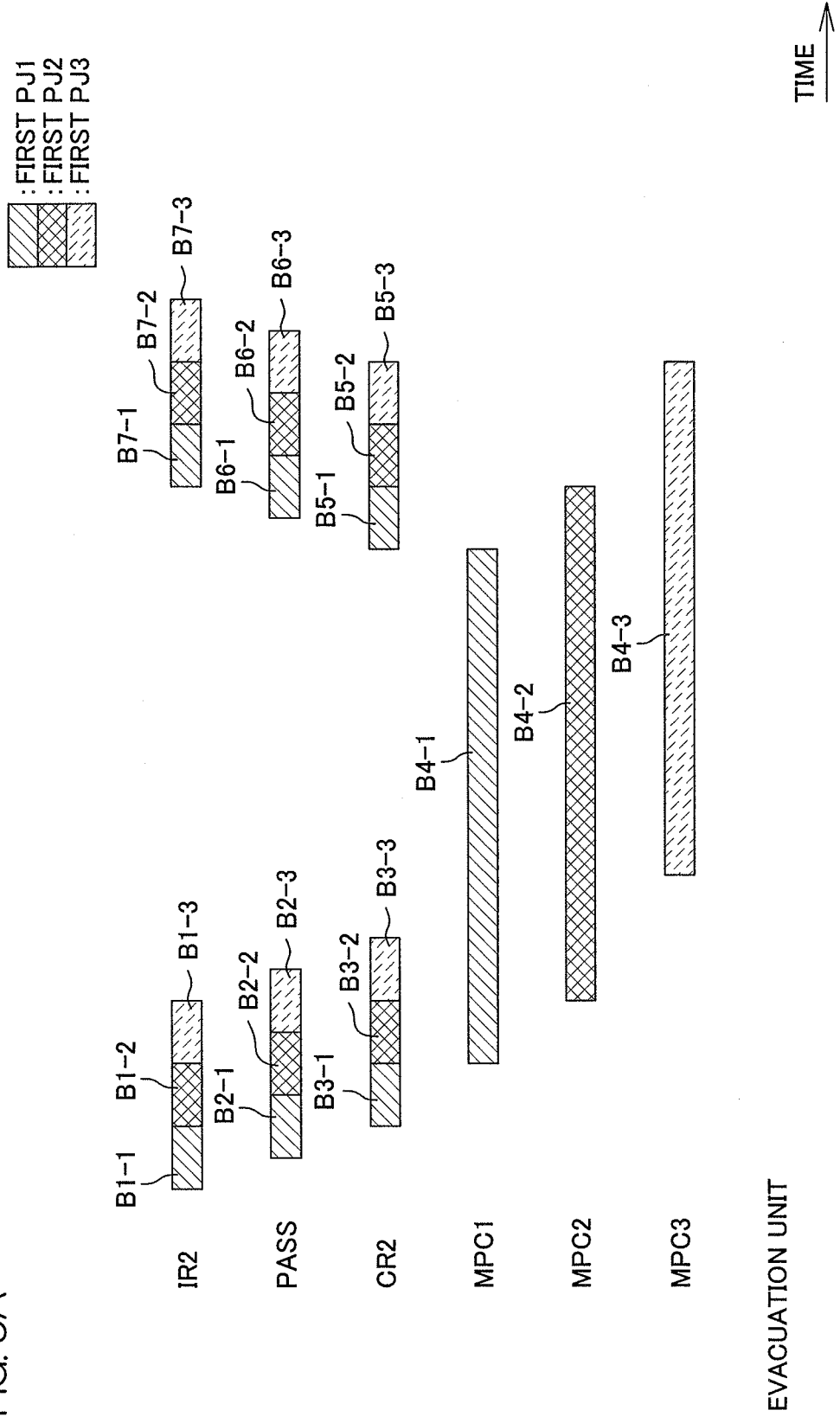
FIG. 9A is a time chart showing a schedule to process three substrates W correlated to three PJs, i.e., a first PJ1, a first PJ2, and a first PJ3, respectively.

As shown in the time chart of FIG. 9A, let it be supposed that a schedule (three first schedules) to process three substrates W correlated to three PJs, i.e., first PJ1 to first PJ3, respectively, has been created in step S34 of FIG. 6. The definitions of bar B1 to bar B7 shown in FIG. 9A are the same as in FIG. 9B to FIG. 9E. Additionally, the branch number in the number of each bar corresponds to the number of the PJ. Additionally, in FIG. 9A to FIG. 9E, the relay unit 28 (see FIG. 2) is represented as "PASS."

During a period of time shown by "bar B1," a "taking-out step" is executed that is from the time when the second indexer robot IR2 starts carrying a substrate W from a carrier C placed on the second load port LP2 or from the intermediate apparatus 3 until the time when the second indexer robot IR2 that has carried the substrate W into the temporarily-holding unit 27 finishes the evacuation from the relay unit 28.

During a period of time shown by "bar B2," a "forward delivering step" is executed that is from the time when a substrate W is carried into the relay unit 28 by means of the second indexer robot IR2 until the time when the substrate W contained in the relay unit 28 is carried out by means of the second center robot CR2.

During a period of time shown by "bar B3," a "carrying-in step" is executed that is from the time when the second center robot CR2 starts carrying the substrate W from the relay unit 28 until the time when the second center robot CR2 that has carried the substrate W into the second processing unit MPC finishes the evacuation from the second processing unit MPC.

During a period of time shown by "bar B4," a "substrate processing step" is executed that is from the time when the substrate W is conveyed from the relay unit 28 to the second processing unit MPC by means of the second center robot CR2 until the time when the substrate W that has been processed by the second processing unit MPC is carried out from the second processing unit MPC by means of the second center robot CR2.

During a period of time shown by "bar B5," a "carrying-out step" is executed that is from the time when the second center robot CR2 starts carrying the substrate W from the second processing unit MPC until the time when the second center robot CR2 that has carried the substrate W into the relay unit 28 finishes the evacuation from the relay unit 28.

During a period of time shown by "bar B6," a "backward delivering step" is executed that is from the time when the substrate W is conveyed from the second processing unit MPC to the relay unit 28 by means of the second center robot CR2 until the time when the substrate W contained in the relay unit 28 is carried out by means of the second indexer robot IR2.

During a period of time shown by "bar B7," a "containing step" is executed that is from the time when the second indexer robot IR2 starts carrying the substrate W from the relay unit 28 until the time when the second indexer robot IR2 that has carried the substrate W into the carrier C placed on the second load port LP2 finishes the evacuation from the carrier C.

Let it be supposed that, in recipes specified by the first PJ1 to the first PJ3, three second processing units MPC1 to MPC3 are specified as concurrent processing units that execute substrate processing specified by the recipes. Therefore, the second control device 24 creates a first schedule at the stage of step S34 of FIG. 6 so that each substrate W is processed by any one of the three second processing units MPC1 to MPC3. In FIG. 9A, scheduling is set up so that a first substrate W is processed by the second processing unit MPC1, and a second substrate W is processed by the second processing unit MPC2, and a third substrate W is processed by the second processing unit MPC3. The second control device 24 executes conveying and/or processing of each substrate W by use of each resource of the second substrate processing apparatus 4 in accordance with the schedule created in step S34 (step S35 of FIG. 6).

As described previously, the second control device 24 monitors whether an additional PJ has been provided in parallel with the processing of step S35 (step S36 of FIG. 10). FIG. 9B shows a processing schedule held by the second control device 24 when the step of carrying out the first substrate W is started. At this point of time, an additional PJ is not provided, and therefore step S36 of FIG. 10 takes "No," and the second control device 24 continues processing in accordance with the existing schedule created in step S34 of FIG. 6 (step S35 of FIGS. 6 and 10).

Processing performed when an additional PJ occurs will be described with reference to FIG. 9C, FIG. 9D, FIG. 9E, FIG. 10, and FIG. 11.

Let it be supposed that, at "Present Time" of the time chart of FIG. 9C, a schedule (one second schedule) correlated to the fourth PJ (the second PJ4) has been added. As a result, step S36 of FIG. 10 takes "Yes," and the second control device 24 shifts to step S37. As a result, the second control device 24 creates a tentative schedule of the second PJ4 (additional PJ) by tentatively disposing the schedule correlated to the additional PJ at the subsequent stage of the existing schedule created in step S34. Let it be supposed that, in the recipe specified by the second PJ4, three second processing units MPC1 to MPC3 are specified as concurrent processing units capable of executing a substrate processing step in the same way as the recipes specified by the first PJ1 to the first PJ3. The processing unit that earliest finishes substrate processing is the second processing unit MPC1 among the second processing units MPC1 to MPC3, and therefore a tentative schedule to carry a substrate W specified by the second PJ4 into the second processing unit MPC1 is created (see FIG. 9C).

More specifically, first, a substrate processing step B4-4 is tentatively arranged immediately behind a substrate processing step B4-1. By tentatively arranging the steps in this way, it is possible to acquire the processing-start expected time of a substrate W that is used in the substrate processing step B4-4. Thereafter, a taking-out step B1-4 of taking out a substrate W from the intermediate apparatus 3 by means of the second indexer robot IR2, a forward delivering step B2-4 of delivering a substrate W from the second indexer robot IR2 to the second center robot CR2 through the PASS (the relay unit 28), and a carrying-in step B3-4 of carrying a substrate W into the second processing unit MPC1 by means of the second center robot CR2 are arranged in chronological order so that it becomes possible to carry the substrate W specified by the second PJ4 into the second processing unit MPC1 until the starting time of the substrate processing step B4-4. Furthermore, a carrying-out step B5-4, a backward delivering step B6-4, and a containing step B7-4 are arranged at the subsequent stage of the substrate processing step B4-4 in chronological order. As a result, a tentative schedule to execute the second PJ4 that is an additional PJ is created (step S37).

In the aforementioned arrangement, a time segment of the substrate processing step B4-4 is tentatively arranged first, and then the taking-out step B3-4 of taking out a substrate W, the forward delivering step B2-4 of forwardly delivering a substrate W, and the carrying-in step B1-4 of carrying in a substrate W that are its pre-steps are tentatively arranged in order. If the time when the substrate W reaches the intermediate apparatus 3 is later than the starting expected time of the tentatively arranged carrying-in step B1-4, the forward delivering step B2-4 of forwardly delivering a substrate W, the taking-out step B3-4 of taking out a substrate W, and the substrate processing step B4-4 must be delayed in order. Therefore, preferably, the creation of a tentative schedule correlated to the second PJ4 (step S37) is executed after the time when a substrate W specified by the second PJ4 reaches the intermediate apparatus 3 is fixed (for example, after this substrate W actually reaches the intermediate apparatus 3).

Thereafter, with respect to the second PJ4 that is an additional PJ, step S38 of FIG. 10 (of acquiring the processing-start expected time and the processing-start time limit) is executed. The "processing-start expected time" corresponds to the start-expected time of the tentatively arranged substrate processing step B4-4, and therefore it is possible to acquire it by creating a tentative schedule correlated to an additional PJ. The "processing-start time limit" is the latest processing-start expected time at which, for example, it is possible to remove contamination that has occurred in the first substrate processing apparatus 2 (for example, etching residues that occur after dry etching) by means of the second substrate processing apparatus 4. If a substrate W starts being processed in the second substrate processing apparatus 4 later than the processing-start time limit, there is a possibility that contamination that has occurred in the first substrate processing apparatus 2 cannot be removed from the substrate W. It is possible to acquire information on this "processing-start time limit" by sending it from the host computer HC to the second control device 24 during a period of time from the time when a substrate W is carried into the first substrate processing apparatus 2 until the time when the substrate W that has been processed by the first substrate processing apparatus 2 is carried into the second substrate processing apparatus 4 through the intermediate apparatus 3. The "processing-start time limit" may be included in the first processing result information or in the substrate arrival information.

Thereafter, the process proceeds to step S39 of FIG. 10, in which a comparison is made between the processing-start expected time and the processing-start time limit. In a tentative schedule created in step S37, if the start-expected time of substrate processing in the second substrate processing apparatus 4 based on a recipe specified by the additional PJ is equal to or the processing-start time limit, it is determined that the existing schedule and the tentative schedule are not required to be changed. On the other hand, if the processing-start expected time is later than the processing-start time limit, it is determined that the existing schedule and the tentative schedule are required to be changed.

In the example of FIG. 9C, the processing-start expected time is equal to or earlier than the processing-start time limit, and therefore the determination of taking "Yes" is made in step S39 of FIG. 10, and the process proceeds to step S40. In step S40, the existing schedule (first schedule) correlated to the first PJ1, to the first PJ2, and to the first PJ3 is not changed. Additionally, the tentative schedule (second schedule) correlated to the second PJ4 created in step S37 is not changed. After step S40, the second control device 24 allows each resource of the second substrate processing apparatus 4 to convey and/or process a substrate W in accordance with the schedule created in step S34 of FIG. 6 and the tentative schedule created in step S37 of FIG. 10 (step S35).

If the schedule correlated to the additional PJ is the first schedule, the aforementioned processing-start time limit does not exist ordinarily. Therefore, if the tentative schedule created in step S37 is the first schedule, the determination of taking "Yes" is made in Step S39 ordinarily, and the process shifts to step S40 from step S39. However, even if the schedule correlated to the additional PJ is the first schedule, there is a possibility that the determination of taking "No" will be made in step S39, and the process will shift to step S41 from step S39 if the PJ specifies a recipe having a processing-start time limit.

FIG. 9D shows a time chart after step S37 of FIG. 10 (creation of the tentative schedule of an additional PJ) is executed in a case in which a second PJ4 in which the processing-start time limit comes equal to or earlier than in the example of FIG. 9C is added. In this example, the processing-start expected time in the second substrate processing apparatus 4 based on the recipe specified by the additional PJ is later than the processing-start time limit, and therefore the determination of taking "No" is made in step S39 of FIG. 10, and the process proceeds to step S41 (change of the existing schedule and of the tentative schedule of an additional PJ).

Figure 11:
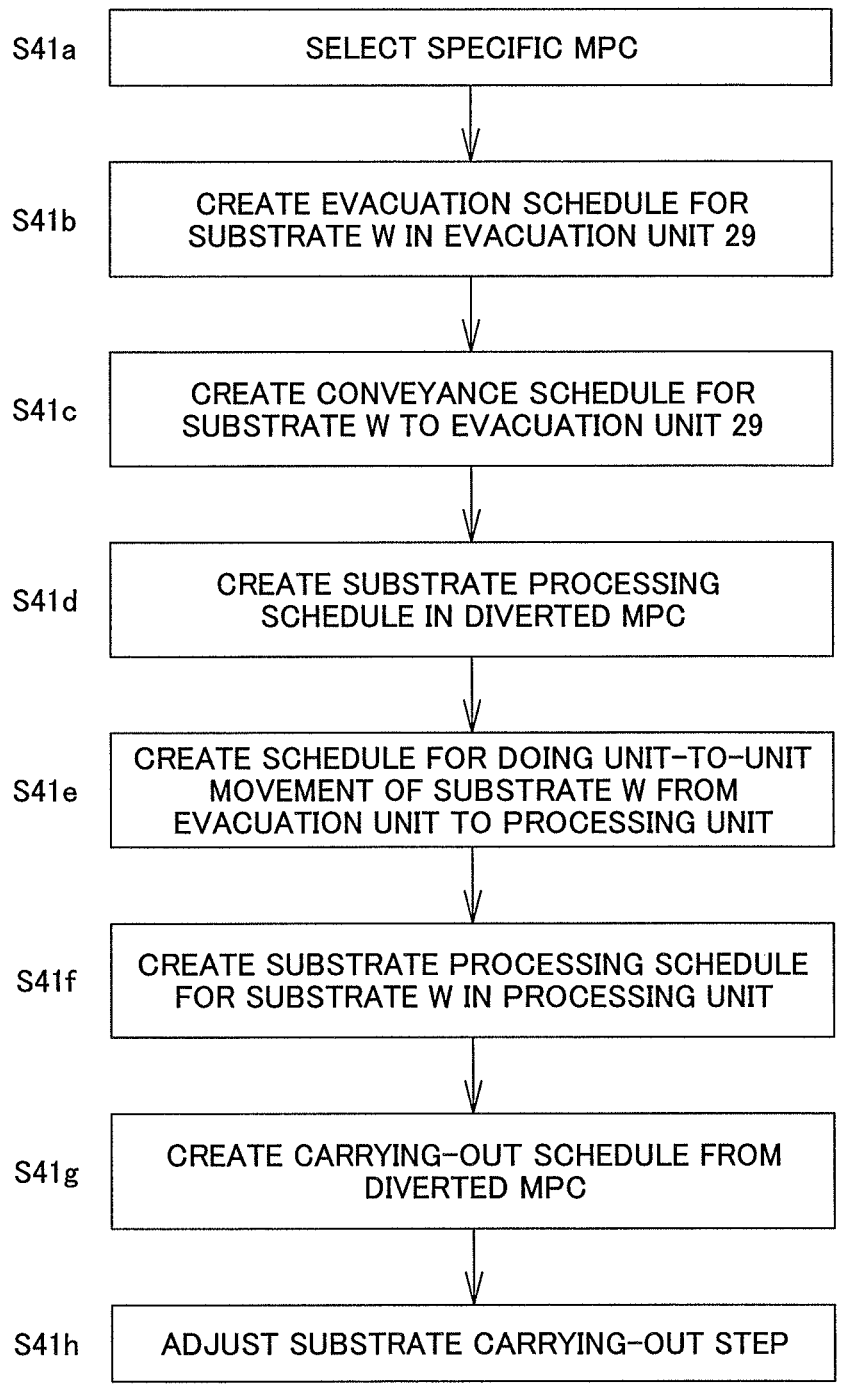
FIG. 11 is a flowchart showing details about changing the first schedule and the second schedule.

FIG. 11 is a flowchart to describe the contents of step S41 in more detail. The second control device 24 changes the time chart of FIG. 9D like the time chart of FIG. 9E in accordance with the flowchart of FIG. 11.

Figure 9E:
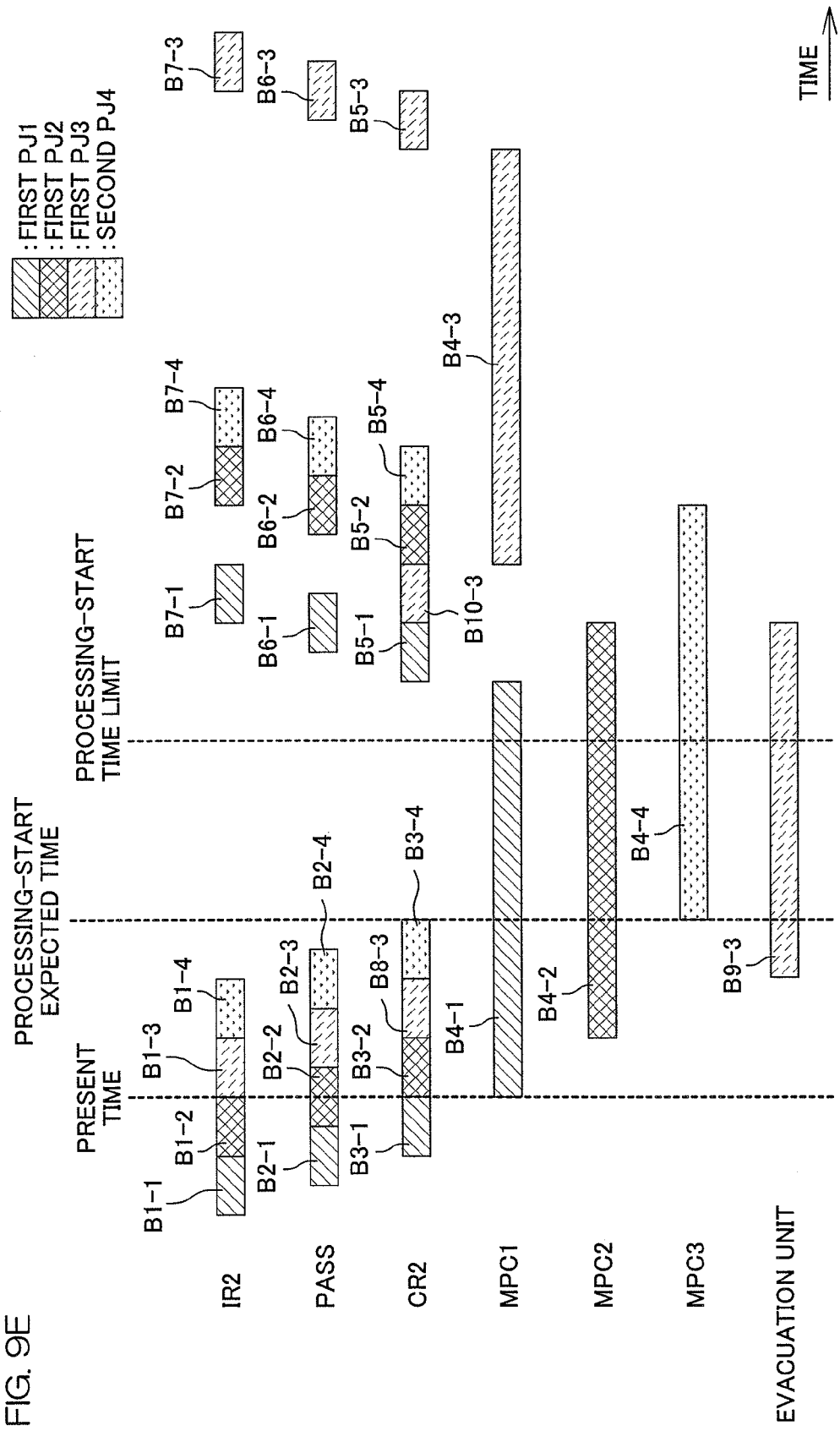
FIG. 9E is a time chart showing schedules (three first schedules and one second schedule) changed so that processing-start expected time precedes a processing-start time limit.

In FIG. 9E, during a period of time shown by "bar B8," a "carrying-in step" is executed that is from the time when the second center robot CR2 starts carrying a substrate W from the relay unit 28 until the time when the second center robot CR2 that has carried the substrate W into the evacuation unit 29 finishes the evacuation from the evacuation unit 29.

During a period of time shown by "bar B9," an "evacuation step" is executed that is from the time when a substrate W is conveyed from the relay unit 28 to the evacuation unit 29 by means of the second center robot CR2 until the time when the substrate W contained in the evacuation unit 29 is carried out by means of the second center robot CR2.

During a period of time shown by "bar B10," a "unit-to-unit movement step" is executed that is from the time when the second center robot CR2 starts carrying out a substrate W from the evacuation unit 29 until the time when the second center robot CR2 that has carried the substrate W into the second processing unit MPC finishes the evacuation from the second processing unit MPC.

In step S41a of FIG. 11, the second processing unit MPC capable of executing a recipe specified by the additional PJ is selected as a specific MPC from among the second processing units MPC. In the recipe specified by the second PJ4 that is an additional PJ, the three second processing units MPC1 to MPC3 are specified as concurrent processing units capable of executing a substrate processing step, and therefore, in step S41a, the second processing units MPC1 to MPC3 are selected as specific MPCs.

In the following step S41b, a schedule is created to select a substrate processing step that is scheduled to be executed by a specific MPC, in which the processing-start expected time is later than the present time and in which the processing-start expected time is equal to or earlier than the processing-start time limit and that is scheduled to evacuate a substrate W, which is to be subjected to the substrate processing step, to the evacuation unit 29. In the example of FIG. 9D, the substrate processing step B4-3 scheduled to be executed by the second processing unit MPC3 satisfies this condition, and therefore the second control device 24 creates a schedule to evacuate a substrate W, which is to be processed in the substrate processing step B4-3, to the evacuation unit 29. This change of the schedule is expressed by assigning a bar B9-3 to the chronological order of the evacuation unit 29 in FIG. 9E. In the following description, the second processing unit MPC that is diverted for a schedule correlated by an additional PJ, like the second processing unit MPC3, is referred to as a "diverted MPC."

In the following step S41c, the existing schedule is changed so that a substrate W to be used in the evacuation step is conveyed to the evacuation unit 29. More specifically, a substrate W specified by the first PJ3 is carried out from the relay unit 28, and then the existing schedule is changed so as to be carried into not the second processing unit MPC3 but the evacuation unit 29. This change of the schedule is expressed by changing bar B3-3 (FIG. 9D) to bar B8-3 (FIG. 9E) in FIG. 9D and FIG. 9E.

In the following step S41d, the existing schedule is changed so that the substrate processing step specified by the additional PJ is started by the diverted MPC until the processing-start time limit. More specifically, each time segment of the taking-out step B1-4, the forward delivering step B2-4, and the carrying-in step B3-4 is arranged in chronological order on the time chart of the existing schedule so that a substrate W specified by the second PJ4 is conveyed to the second processing unit MPC3. Additionally, the substrate processing step B4-4 of the substrate W specified by the second PJ4 is assigned to the second processing unit MPC3.

In the following step S41e, the schedule of the unit-to-unit movement step is created to take a substrate W, which is being evacuated in the evacuation unit 29, from the evacuation unit 29 as soon as the second executable processing unit MPC capable of executing the substrate processing of the substrate W occurs and to move the second processing unit MPC. In an example according to the present preferred embodiment, a schedule is created to move the substrate W being evacuated in the evacuation unit 29 to the second processing unit MPC1 from the evacuation unit 29. In FIG. 9E, this schedule creation is expressed by arranging the bar B10-3 that is the unit-to-unit movement step of taking a substrate W from the evacuation unit 29 and of carrying the substrate W into the second processing unit MPC1 immediately after the bar B5-1 that is the substrate carrying-out step of carrying out a substrate W from the second processing unit MPC1.

In the following step S41f, a schedule of the substrate processing step is created to process a substrate W that has moved to another second processing unit MPC by means of that second processing unit MPC. In an example according to the present preferred embodiment, a schedule is created to start the substrate processing step B4-3 by means of the second processing unit MPC1 immediately after the unit-to-unit movement step B10-3.

In the following step S41g, a schedule of the carrying-out step is created to carry out a substrate W from the diverted MPC. In an example according to the present preferred embodiment, a schedule is created to successively execute the carrying-out step B5-4 of carrying out a substrate W, the backward delivering step B6-4, and the containing step B7-4 that are correlated to the second PJ4 immediately after the substrate processing step B4-4 of processing a substrate W by means of the second processing unit MPC3.

In the following step S41h, the carrying-out step of carrying out a substrate W is adjusted because the previous existing schedules have been changed and because the schedules correlated to the additional PJ have been added. In an example according to the present preferred embodiment, a schedule is created so that the performing timing of the carrying-out step B5-2 of carrying out a substrate W, the backward delivering step B6-2, and the containing step B7-2 that are specified by the first PJ2 goes down further than that of the existing schedule as a result of the scheduling that has been executed in step S41a to step S41g.

The schedule (first schedule) created in step S34 and the tentative schedule (second schedule) created in step S37 are changed in step S41 as described above, and then the second control device 24 allows each resource of the second substrate processing apparatus 4 to convey and/or process a substrate W in accordance with a schedule resulting from its change (step S35).

As described above, in the present preferred embodiment, the second control device 24 creates the first schedule so that a substrate W contained in a carrier C is conveyed from the second load port LP2 to the second processing unit MPC and so that the substrate W processed by the second processing unit MPC is conveyed from the second processing unit MPC to the second load port LP2. Furthermore, the second control device 24 creates the second schedule so that the substrate W processed by the first substrate processing apparatus 2 is conveyed from the direct carry-in entrance 25a to the second processing unit MPC and so that the substrate W processed by the second processing unit MPC is conveyed from the second processing unit MPC to the second load port LP2. The second control device 24 creates the second schedule so that at least one step included in the second schedule is executed simultaneously with at least one step included in the first schedule.

The second control device 24 creates the second schedule, and then determines whether the processing-start expected time of the substrate W planned in the second schedule is equal to or earlier than the processing-start time limit to process the substrate W, which has been processed by the first substrate processing apparatus 2, by means of the second substrate processing apparatus 4. If the processing-start expected time is equal to or earlier than the processing-start time limit, the second control device 24 allows the second substrate processing apparatus 4 to execute the first schedule and the second schedule that are initial schedules. On the other hand, if the processing-start expected time is later than the processing-start time limit, the second control device 24 changes the first schedule and the second schedule that are initial schedules so that the processing-start expected time becomes equal to or earlier than the processing-start time limit, and allows the second substrate processing apparatus 4 to execute a first schedule and a second schedule that have been acquired by being changed. This makes it possible to start the processing of the substrate W planned in the second schedule before the processing-start time limit, and makes it possible to prevent the substrate W from falling in quality.

Additionally, in the present preferred embodiment, the second schedule is created after the substrate W processed by the first substrate processing apparatus 2 arrives at the intermediate apparatus 3. The processing-start expected time of the substrate W planned in the second schedule is the expected time at which the substrate W starts being processed by the second substrate processing apparatus 4. In other words, there is a difference between an actually necessary period of time for an apparatus, such as a transfer robot, to perform an operation and an expected period of time regarded as being necessary to perform this operation, and therefore it is difficult to expect accurate time at which processing is actually started. In particular, uncertain factors will increase if the conveying distance of a substrate W is long, and therefore a difference between an actually necessary period of time and an expected period of time is increased, and the accuracy of the processing-start expected time falls. Therefore, it is possible to raise the accuracy of the processing-start expected time by creating the second schedule after a substrate W arrives at the intermediate apparatus 3, i.e., after a substrate W approaches the second substrate processing apparatus 4 so that the conveying distance of the substrate W becomes short. This makes it possible to compare more accurate processing-start expected time with the processing-start time limit, and hence makes it possible to start to process a substrate W planned in the second schedule before the processing-start time limit.

Additionally, in the present preferred embodiment, if the processing-start expected time is later than the processing-start time limit, the second control device 24 changes the initial first schedule so that a substrate W is conveyed from the plurality of second load ports LP2 to the plurality of second processing units MPC through the evacuation unit 29. Furthermore, the second control device 24 makes the processing-start expected time earlier so that the processing-start expected time becomes equal to or earlier than the processing-start time limit by changing the initial second schedule so that a substrate W that has been carried in from the direct carry-in entrance 25a is carried into the second processing unit MPC scheduled to process a substrate W in accordance with the first schedule that has not yet been changed. Thereafter, the second control device 24 allows the second substrate processing apparatus 4 to execute a first schedule and a second schedule acquired by being changed. As a result, the processing of a substrate W corresponding to the second schedule takes precedence over the processing of a substrate W corresponding to the first schedule, and the substrate W corresponding to the second schedule starts being processed before the processing-start time limit.

Additionally, in the present preferred embodiment, substrate processing conditions are set in accordance with an inspection result of the first inspection unit 9 that inspects the quality of a substrate W before the substrate W processed by the first substrate processing apparatus 2 is carried into the second substrate processing apparatus 4. Thereafter, the second control device 24 creates the second schedule so that the second processing unit MPC processes a substrate W under substrate processing conditions according to the inspection result. Therefore, it is possible to process a substrate W under conditions according to the quality of the substrate W, and it is possible to raise the quality of the substrate W, such as cleanliness.

Additionally, in the present preferred embodiment, the first inspection unit 9 is provided in the first substrate processing apparatus 2, and the quality of a substrate W processed by the first substrate processing apparatus 2 is inspected by the first substrate processing apparatus 2. If the first inspection unit 9 is provided in an apparatus other than the first substrate processing apparatus 2 and the intermediate apparatus 3, i.e., if the first inspection unit 9 is provided outside the conveying path of a substrate W, the substrate W is required to be conveyed to the outside of the first substrate processing apparatus 2 and of the intermediate apparatus 3, and therefore an extra conveying time for it is generated. Therefore, it is possible to shorten the conveying time of a substrate W from the first substrate processing apparatus 2 to the second substrate processing apparatus 4 by providing the first inspection unit 9 in the first substrate processing apparatus 2.

Although the embodiment of the present invention has been described above, the present invention is not restricted to the contents of the above-described embodiment and various modifications are possible within the scope of the present invention.

For example, as described in the above preferred embodiment, if the processing-start expected time is later than the processing-start time limit in the initial second schedule, the first schedule and the second schedule are changed so that the processing-start expected time becomes equal to or earlier than the processing-start time limit. However, even if the processing-start expected time exceeds the processing-start time limit in the initial second schedule, the second control device 24 may allow the resource of the second substrate processing apparatus 4 to execute the initial second schedule, and may inform the host computer HC of the fact that a substrate W has started being processed after the processing-start time limit. Alternatively, the second control device 24 may change the second schedule so that a substrate W is conveyed from the intermediate apparatus 3 to the second load port LP2 without being conveyed via the second processing unit MPC, and may inform the host computer HC of the fact that the processing of the substrate W has been avoided in the second substrate processing apparatus 4.

Additionally, as described in the above preferred embodiment, a recipe initially specified by a PJ is replaced with a recipe that reflects an inspection result of the first inspection unit 9, and substrate processing conditions in the second processing unit MPC are changed. In other words, as described above, a substrate W is processed by the second processing unit MPC whatever the inspection result is. However, a substrate W may be processed by a recipe initially specified without being replaced with another recipe. Additionally, the second control device 24 may create a second schedule so that a substrate W may avoid the second processing unit MPC and may be conveyed from the intermediate apparatus 3 to the second load port LP2 based on an inspection result of the first inspection unit 9 (inspection information sent from the host computer HC).

More specifically, the second control device 24 may create a second schedule so that a substrate W that is carried into the second substrate processing apparatus 4 through the direct carry-in entrance 25a avoids the plurality of second processing units MPC and so that the substrate W is conveyed from the outside of the second substrate processing apparatus 4 to the second load port LP2 by means of the second transfer unit (the second indexer robot IR2, the second center robot CR2, and the temporarily-holding unit 27), and may allow the resource of the second substrate processing apparatus 4 to execute the resulting second schedule. Alternatively, the second control device 24 may create a second schedule so that a substrate W that is carried into the second substrate processing apparatus 4 through the direct carry-in entrance 25a is conveyed from the intermediate apparatus 3 to the evacuation unit 29 by means of the second indexer robot IR2, and may allow the resource of the second substrate processing apparatus 4 to execute the resulting second schedule.

Additionally, as described in the above preferred embodiment, the first inspection unit 9 measures the line width of a pattern formed on the front surface of a substrate W that has been processed (a substrate W that has undergone dry etching), and yet an inspection other than the line width measurement may be performed by the first inspection unit 9. For example, if the first substrate processing apparatus 2 is a film formation apparatus, the thickness of a thin film formed by the first substrate processing apparatus 2 may be measured by the first inspection unit 9.

Additionally, as described in the above preferred embodiment, an inspection unit (first inspection unit 9) that inspects the quality of a substrate W is provided in the first substrate processing apparatus 2, and yet the inspection unit may be provided in the intermediate apparatus 3. Additionally, the first inspection unit 9 may be excluded from the substrate processing system 1.

Additionally, as described in the above preferred embodiment, the first inspection unit 9 inspects all substrates W that have been processed by the first substrate processing apparatus 2, and yet only some substrates W that have been processed by the first substrate processing apparatus 2 may be inspected by the first inspection unit 9.

Additionally, as described in the above preferred embodiment, the first substrate processing apparatus 2, the intermediate apparatus 3, and the second substrate processing apparatus 4 are arranged in this order in the horizontal arrangement direction D1 of carriers C, and yet the first substrate processing apparatus 2, the intermediate apparatus 3, and the second substrate processing apparatus 4 may be arranged in this order in a horizontal orthogonal direction D2 perpendicular to the arrangement direction D1 of carriers C.

Additionally, as described in the above preferred embodiment, the evacuation box 32 of the evacuation unit 29 includes an opening that is open toward the second indexer robot IR2 and an opening that is open toward the second center robot CR2, and yet one of the two openings may be excluded so that only one of the second indexer robot IR2 and the second center robot CR2 is accessible to the inside of the evacuation unit 29. In other words, it is only necessary to arrange the evacuation box 32 so that the hands H of at least one of the second indexer robot IR2 and the second center robot CR2 are enterable into the evacuation box 32.

Additionally, as described in the above preferred embodiment, the second processing module 23 includes the temporarily-holding unit 27, and a second transfer unit includes the second indexer robot IR2, the second center robot CR2, and the temporarily-holding unit 27, and yet the temporarily-holding unit 27 may be excluded, and the second indexer robot IR2 and the second center robot CR2 may directly deliver a substrate W.

Additionally, as described in the above preferred embodiment, the second opening-closing device that opens and closes the downstream shutter 19 by which the direct carry-in entrance 25a is opened and closed is controlled by the intermediate control device 13, and yet the second opening-closing device may be controlled by the second control device 24.

Additionally, two or more among all aforementioned preferred embodiments may be combined together.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2013-168952 filed in the Japan Patent Office on Aug. 15, 2013, the disclosure of which is incorporated herein by reference by its entirety.

DESCRIPTION OF THE SYMBOLS

1: Substrate processing system
2: First substrate processing apparatus
3: Intermediate apparatus
4: Second substrate processing apparatus
9: First inspection unit
11: Upstream supporting member
12: Downstream supporting member
13: Intermediate control device
14: Intermediate box
15: Upstream box
16: Box body
17: Downstream box
18: Upstream shutter
19: Downstream shutter
20: Exhaust duct
22: Second indexer module
23: Second processing module
24: Second control device
25: Second indexer box
25a: Direct carry-in entrance
27: Temporarily-holding unit
28: Relay unit
29: Evacuation unit
41: Scheduling portion
42: Job management list
43: Job management portion
44: Scheduling engine
45: Processing execution command portion
C: Carrier
CR2: Second center robot
HC: Host computer
IR1: First indexer robot
IR2: Second indexer robot
LP1: First load port
LP2: Second load port
MPC: Second processing unit
R3: Intermediate transfer robot
W: Substrate

What is claimed is:

1. A substrate processing apparatus connected to an intermediate apparatus, the intermediate apparatus conveying a substrate that has been processed by a first substrate processing apparatus in a state of directly supporting the substrate outside the first substrate processing apparatus, the substrate processing apparatus comprising:
   a plurality of load ports that hold a plurality of carriers that are capable of containing a plurality of substrates, respectively;

a direct carry-in entrance that accepts a substrate carried in from the intermediate apparatus;

a plurality of processing units that process a substrate conveyed from at least either the plurality of load ports or the direct carry-in entrance;

a transfer unit that conveys a substrate among the plurality of load ports, the direct carry-in entrance, and the plurality of processing units; and a control device that controls the substrate processing apparatus; wherein the control device execute:

a first step that creates a first schedule, the first schedule including a first carrying-in step of allowing the transfer unit to convey a substrate from the plurality of load ports to the plurality of processing units, a first processing step of allowing the plurality of processing units to process the substrate conveyed to the plurality of processing units, and a first carrying-out step of allowing the transfer unit to convey the substrate processed by the plurality of processing units from the plurality of processing units to the plurality of load ports;

a second step that creates a second schedule, the second schedule including a second carrying-in step of allowing the transfer unit to convey a substrate processed by the first substrate processing apparatus from the direct carry-in entrance to the plurality of processing units, a second processing step of allowing the plurality of processing units to process the substrate conveyed to the plurality of processing units, and a second carrying-out step of allowing the transfer unit to convey the substrate processed by the plurality of processing units from the plurality of processing units to the plurality of load ports, the second schedule being created so that at least one of the second carrying-in step, the second processing step, and the second carrying-out step is executed simultaneously with at least one of the first carrying-in step, the first processing step, and the first carrying-out step;

a third step of determining whether a processing-start expected time for a substrate planned in the second schedule is equal to or earlier than a processing-start time limit to allow the substrate processing apparatus to process a substrate processed by the first substrate processing apparatus;

a fourth step of, if the processing-start expected time is later than the processing-start time limit in the third step, changing the first schedule and the second schedule so that the processing-start expected time becomes equal to or earlier than the processing-start time limit and allowing the substrate processing apparatus to execute the first schedule and the second schedule that have been changed; and a fifth step of, if the processing-start expected time is equal to or earlier than the processing-start time limit in the third step, allowing the substrate processing apparatus to execute the first schedule and the second schedule without changing the first schedule and the second schedule.

2. The substrate processing apparatus according to claim 1, wherein the second step is a step of creating the second schedule after a substrate processed by the first substrate processing apparatus arrives at the intermediate apparatus.

3. The substrate processing apparatus according to claim 1, further comprising an evacuation unit that evacuates a substrate, wherein the fourth step is a step of, if the processing-start expected time is later than the processing-start time limit in the third step, changing the first schedule so that a substrate is conveyed from the plurality of load ports to the plurality of processing units through the evacuation unit, and changing the second schedule so that a substrate carried in from the direct carry-in entrance is carried into the processing unit scheduled to process a substrate in the first schedule that has not yet been changed so as to make the processing-start expected time earlier so that the processing-start expected time becomes equal to or earlier than the processing-start time limit, and allowing the substrate processing apparatus to execute the first schedule and the second schedule that have been changed.

4. The substrate processing apparatus according to claim 1, wherein the control device further executes a sixth step of setting a substrate processing condition in accordance with an inspection result of an inspection unit that inspects a substrate processed by the first substrate processing apparatus before the substrate is carried into the substrate processing apparatus, and wherein the second step is a step of creating the second schedule so that the substrate is processed under the substrate processing condition in the second processing step.

5. The substrate processing apparatus according to claim 4, wherein the sixth step is a step of setting the substrate processing condition in accordance with an inspection result of the inspection unit provided in one of the first substrate processing apparatus and the intermediate apparatus.

6. A substrate processing method executed by a substrate processing apparatus, the substrate processing apparatus connected to an intermediate apparatus, the intermediate apparatus conveying a substrate that has been processed by a first substrate processing apparatus that processes substrates in a state of directly supporting the substrate outside the first substrate processing apparatus, the substrate processing apparatus including:

a plurality of load ports that hold a plurality of carriers that are capable of containing a plurality of substrates, respectively;

a direct carry-in entrance that accepts a substrate carried in from the intermediate apparatus;

a plurality of processing units that process a substrate conveyed from at least either the plurality of load ports or the direct carry-in entrance;

a transfer unit that conveys a substrate among the plurality of load ports, the direct carry-in entrance, and the plurality of processing units; and a control device that controls the substrate processing apparatus;

the substrate processing method comprising:

a first step that creates a first schedule including a first carrying-in step of allowing the transfer unit to convey a substrate from the plurality of load ports to the plurality of processing units, a first processing step of allowing the plurality of processing units to process the substrate conveyed to the plurality of processing units, and a first carrying-out step of allowing the transfer unit to convey the substrate processed by the plurality of processing units from the plurality of processing units to the plurality of load ports;

a second step that creates a second schedule including a second carrying-in step of allowing the transfer unit to convey a substrate processed by the first substrate processing apparatus from the direct carry-in entrance to the plurality of processing units, a second processing step of allowing the plurality of processing units to process the substrate conveyed to the plurality of processing units, and a second carrying-out step of allowing the transfer unit to convey the substrate processed by the plurality of processing units from the plurality of processing units to the plurality of load ports, the second schedule being created so that at least one of the second carrying-in step, the second processing step, and the second carrying-out step is executed simultaneously with at least one of the first carrying-in step, the first processing step, and the first carrying-out step;

a third step of determining whether processing-start expected time for a substrate planned in the second schedule is equal to or earlier than a processing-start time limit to allow the substrate processing apparatus to process a substrate processed by the first substrate processing apparatus;

a fourth step of, if the processing-start expected time is later than the processing-start time limit in the third step, changing the first schedule and the second schedule so that the processing-start expected time becomes equal to or earlier than the processing-start time limit and allowing the substrate processing apparatus to execute the first schedule and the second schedule that have been changed; and a fifth step of, if the processing-start expected time is equal to or earlier than the processing-start time limit in the third step, allowing the substrate processing apparatus to execute the first schedule and the second schedule without changing the first schedule and the second schedule.

7. The substrate processing method according to claim 6, wherein the second step is a step of creating the second schedule after a substrate processed by the first substrate processing apparatus arrives at the intermediate apparatus.

8. The substrate processing method according to claim 6, wherein the substrate processing apparatus further includes an evacuation unit that evacuates a substrate, and
wherein the fourth step is a step of, if the processing-start expected time is later than the processing-start time limit in the third step, changing the first schedule so that a substrate is conveyed from the plurality of load ports to the plurality of processing units through the evacuation unit, and changing the second schedule so that a substrate carried in from the direct carry-in entrance is carried into the processing unit scheduled to process a substrate in the first schedule that has not yet been changed so as to make the processing-start expected time earlier so that the processing-start expected time becomes equal to or earlier than the processing-start time limit, and allowing the substrate processing apparatus to execute the first schedule and the second schedule that have been changed.

9. The substrate processing method according to claim 6, further comprising a sixth step of setting a substrate processing condition in accordance with an inspection result of an inspection unit that inspects a substrate processed by the first substrate processing apparatus before the substrate is carried into the substrate processing apparatus,
wherein the second step is a step of creating the second schedule so that the substrate is processed under the substrate processing condition in the second processing step.

10. The substrate processing method according to claim 9, wherein the sixth step is a step of setting the substrate processing condition in accordance with an inspection result of the inspection unit provided in one of the first substrate processing apparatus and the intermediate apparatus.

11. A substrate processing system comprising:
a first substrate processing apparatus that processes a substrate;
the substrate processing apparatus according to claim 1; and
an intermediate apparatus that conveys a substrate processed by the first substrate processing apparatus among the first substrate processing apparatus and the substrate processing apparatus in a state of directly supporting the substrate outside the first substrate processing apparatus.

12. The substrate processing method according to claim 7, wherein the substrate processing apparatus further includes an evacuation unit that evacuates a substrate, and
wherein the fourth step is a step of, if the processing-start expected time is later than the processing-start time limit in the third step, changing the first schedule so that a substrate is conveyed from the plurality of load ports to the plurality of processing units through the evacuation unit, and changing the second schedule so that a substrate carried in from the direct carry-in entrance is carried into the processing unit scheduled to process a substrate in the first schedule that has not yet been changed so as to make the processing-start expected time earlier so that the processing-start expected time becomes equal to or earlier than the processing-start time limit, and allowing the substrate processing apparatus to execute the first schedule and the second schedule that have been changed.

* * * * *